(12) United States Patent
Shim et al.

(10) Patent No.: US 12,195,385 B2
(45) Date of Patent: Jan. 14, 2025

(54) GLASS MANUFACTURING APPARATUS AND GLASS MANUFACTURING METHOD USING THE SAME

(71) Applicant: SAMSUNG DISPLAY CO., LTD., Yongin-si (KR)

(72) Inventors: Gyu In Shim, Yongin-si (KR); Byung Hoon Kang, Hwaseong-si (KR); Seung Hoon Kim, Seongnam-si (KR); Seung Ho Kim, Asan-si (KR); Su Jin Sung, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 831 days.

(21) Appl. No.: 17/317,370

(22) Filed: May 11, 2021

(65) Prior Publication Data

US 2022/0009828 A1 Jan. 13, 2022

(30) Foreign Application Priority Data

Jul. 8, 2020 (KR) .................. 10-2020-0084159

(51) Int. Cl.
*C03C 19/00* (2006.01)
*B24B 7/24* (2006.01)
(Continued)

(52) U.S. Cl.
CPC ............. *C03C 19/00* (2013.01); *B24B 7/241* (2013.01); *H10K 50/844* (2023.02); *H10K 59/12* (2023.02); *H10K 59/40* (2023.02); *H10K 71/00* (2023.02); *H10K 77/111* (2023.02); *H10K 2102/311* (2023.02)

(58) Field of Classification Search
CPC ........... B24B 7/241; B24B 7/242; B24B 7/24; B24B 7/247; B24B 9/10; B24B 9/08; B24B 9/146; B24B 13/008; B24B 13/005; B24B 27/0076; B24B 29/02; B24B 41/06; B24B 41/068; C03C 19/00
USPC .................. 451/41, 287, 390, 412, 490, 512; 269/289 R, 302.1
See application file for complete search history.

(56) References Cited

U.S. PATENT DOCUMENTS 6,716,085 B2  4/2004  Wiswesser et al.
2011/0265517 A1  11/2011  Keebler et al.
(Continued)

FOREIGN PATENT DOCUMENTS

CN  106312745 A  * 1/2017  .......... B24B 13/005
KR  1020150142511  12/2015
(Continued)

OTHER PUBLICATIONS

Machine translation of CN-106312745-A (Year: 2017).*

*Primary Examiner* — Robert F Neibaur
(74) *Attorney, Agent, or Firm* — F. Chau & Associates, LLC

(57) ABSTRACT

A glass manufacturing apparatus includes a support configured to hold a glass including a first flat portion, a second flat portion, and a curved portion connecting one side of the first flat portion and one side of the second flat portion. The support includes a first flat surface supporting the first flat portion, a second flat surface facing the first flat surface and supporting the second flat portion, and a curved surface connecting the flat surface to the second flat surface and supporting the curved portion.

16 Claims, 24 Drawing Sheets

(51) Int. Cl.
*H10K 50/844* (2023.01)
*H10K 59/12* (2023.01)
*H10K 59/40* (2023.01)
*H10K 71/00* (2023.01)
*H10K 77/10* (2023.01)
*H10K 102/00* (2023.01)

(56) References Cited

U.S. PATENT DOCUMENTS

| | | | |
|---|---|---|---|
| 2012/0052302 A1 | 3/2012 | Matusick et al. | |
| 2016/0052101 A1* | 2/2016 | Misaka | B24B 13/005 |
| | | | 451/388 |
| 2018/0059454 A1 | 3/2018 | Shin et al. | |
| 2018/0282207 A1* | 10/2018 | Fujii | C03B 21/04 |
| 2019/0339746 A1 | 11/2019 | Kim et al. | |

FOREIGN PATENT DOCUMENTS

| | | |
|---|---|---|
| KR | 10-1842326 | 3/2018 |
| KR | 1020180076752 | 7/2018 |

* cited by examiner

FIG. 21
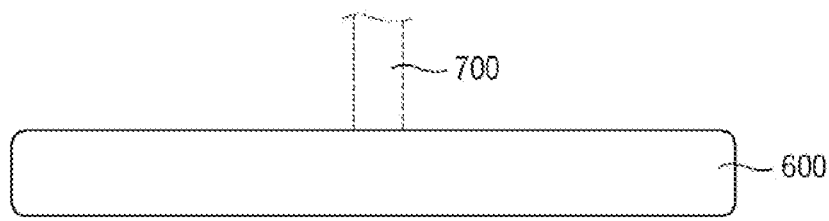
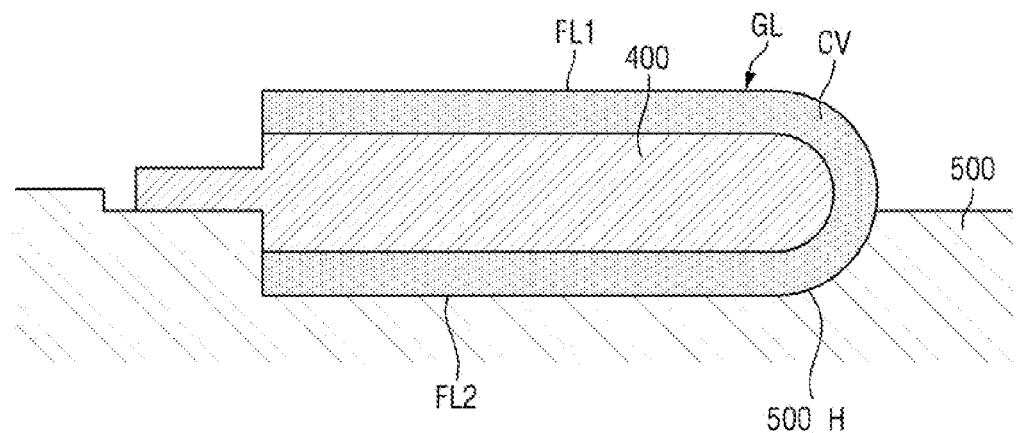
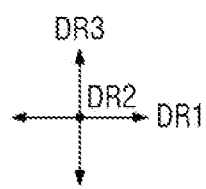

FIG. 25
(a)
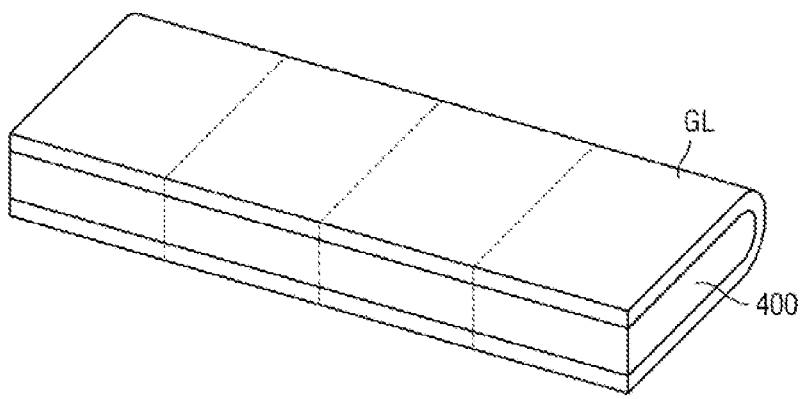
(b)
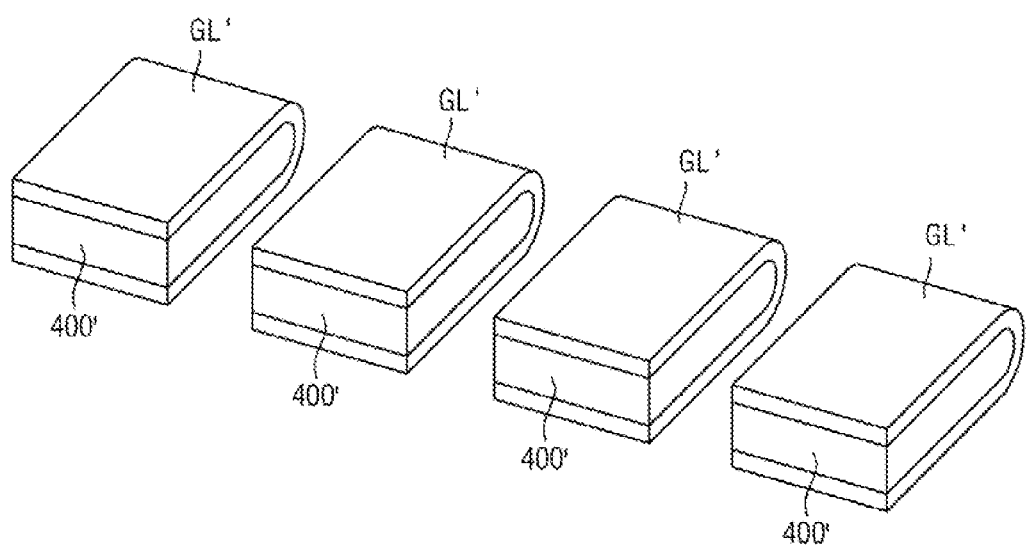

GLASS MANUFACTURING APPARATUS AND GLASS MANUFACTURING METHOD USING THE SAME

CROSS-REFERENCE TO RELATED APPLICATION

This U.S. non-provisional patent application claims priority under 35 U.S.C. 119 to Korean Patent Application No. 10-2020-0084159, filed on Jul. 8, 2020 in the Korean Intellectual Property Office, the disclosure of which is incorporated by reference in its entirety herein.

TECHNICAL FIELD

The present invention relates to a glass manufacturing apparatus and a glass manufacturing method using the same.

DISCUSSION OF THE RELATED ART

A flat-panel display (FPD) is an electronic display device that is lighter, thinner, and uses less power than a traditional cathode ray (CRT) display. Examples of FPDs include a liquid crystal display (LCD) and an organic light emitting display (OLED).

An FPD includes a display panel and may further include glass that protects the display panel and forms an exterior. As an example, the glass may have a plate shape.

A haze phenomenon may occur when a surface of the glass is too rough. A polishing process may be performed on the glass to provide a smoother surface for reducing the haze phenomenon. However, it can be difficult to perform the polishing process unless the glass is completely flat.

SUMMARY

At least one embodiment of the present invention provides a glass manufacturing apparatus for polishing a glass product bent in a U-shape, and a glass manufacturing method using the same.

According to an embodiment of the invention, a glass manufacturing apparatus includes a support configured to hold a glass including a first flat portion, a second flat portion, and a curved portion connecting one side of the first flat portion and one side of the second flat portion. The support includes a first flat surface supporting the first flat portion, a second flat surface facing the first flat surface and supporting the second flat portion, and a curved surface connecting the flat surface to the second flat surface and supporting the curved portion.

According to an embodiment of the invention, a glass manufacturing apparatus includes a jig configured to be at least partially inserted into a glass including a first flat portion, a second flat portion, and a curved portion connecting the first flat portion to the second flat portion. The jig includes a first flat surface supporting the first flat portion, a second flat surface facing the first flat surface and supporting the second flat portion, and a curved surface connecting the flat surface to the second flat surface and supporting the curved portion.

According to an embodiment of the disclosure, a glass manufacturing method includes inserting a jig into a glass including a first flat portion, a second flat portion, and a curved portion connecting the first flat portion to the second flat portion; placing the jig in a receiving groove of a stage to expose an upper surface of the first flat portion of the glass; and polishing the exposed upper surface of the first flat portion of the glass using a polishing pad.

BRIEF DESCRIPTION OF THE DRAWINGS

The present invention will become more apparent by describing in detail embodiments thereof with reference to the attached drawings, in which:

FIGS. 21 to 24 are views illustrating steps of the glass manufacturing method of FIG. 20 according to an embodiment of the invention; and FIG. 25 is a view illustrating a glass manufacturing method according to an embodiment of the invention.

DETAILED DESCRIPTION OF EMBODIMENTS

The present invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present.

Hereinafter, embodiments of the present invention will be described with reference to the attached drawings.

Figure 1:
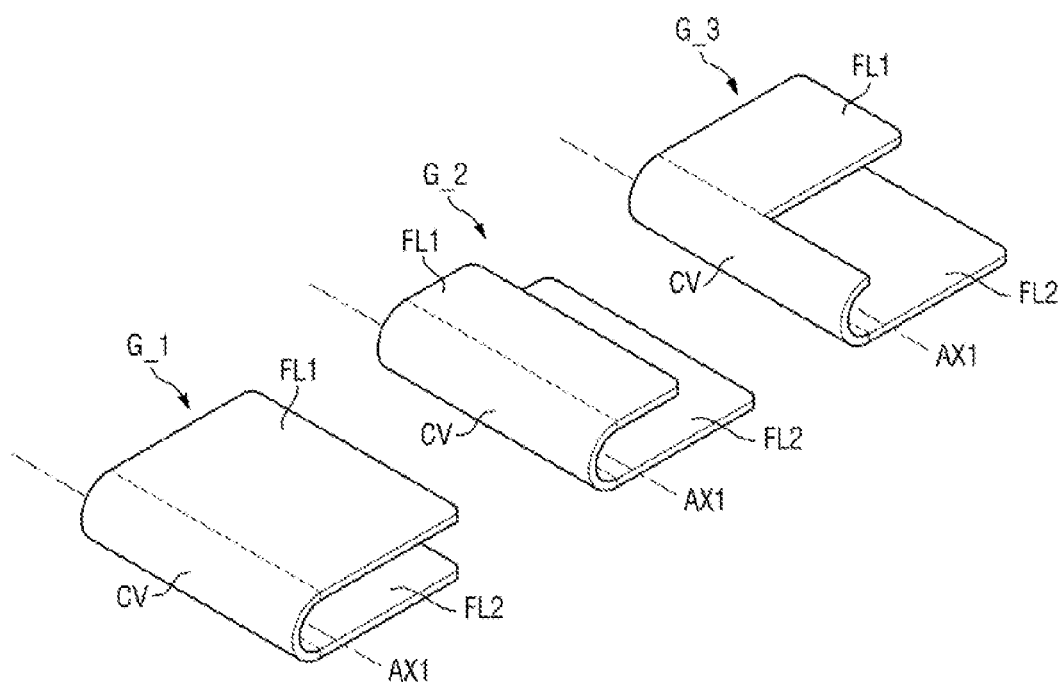
FIG. 1 is a perspective view of exemplary glass products related to a glass manufacturing apparatus.
Figure 2:
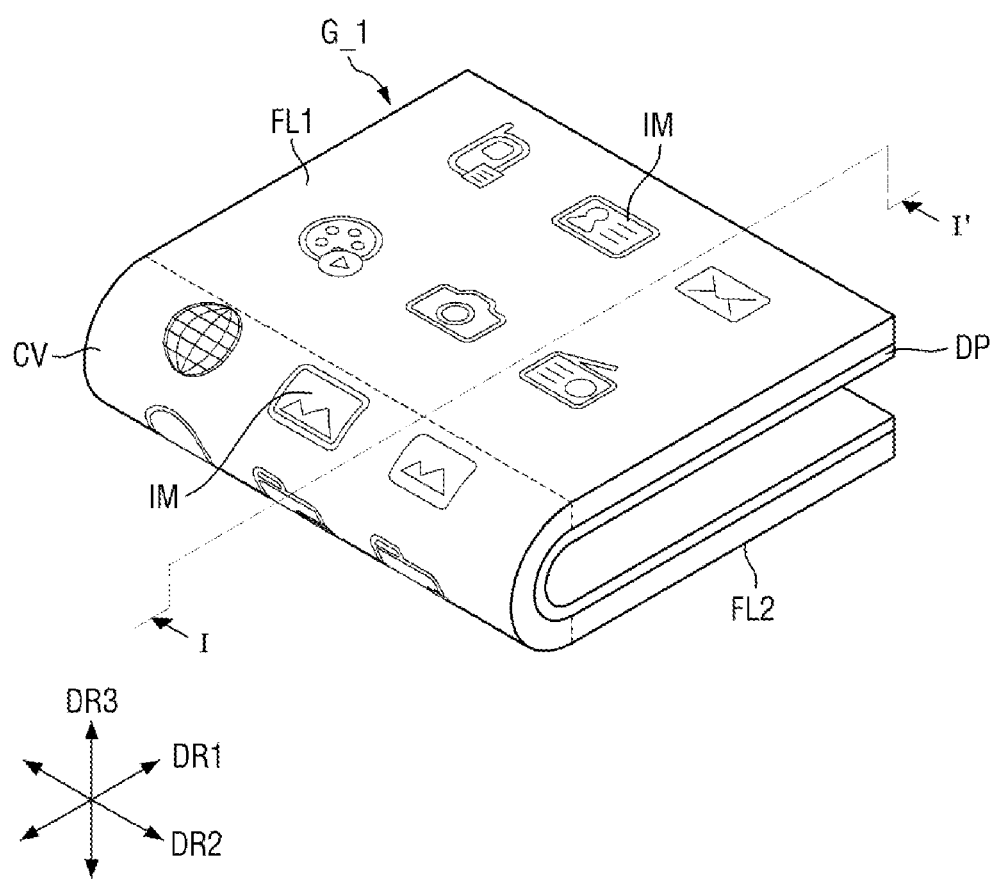
FIG. 2 is a perspective view of a glass product to which a display panel is attached.
Figure 3:
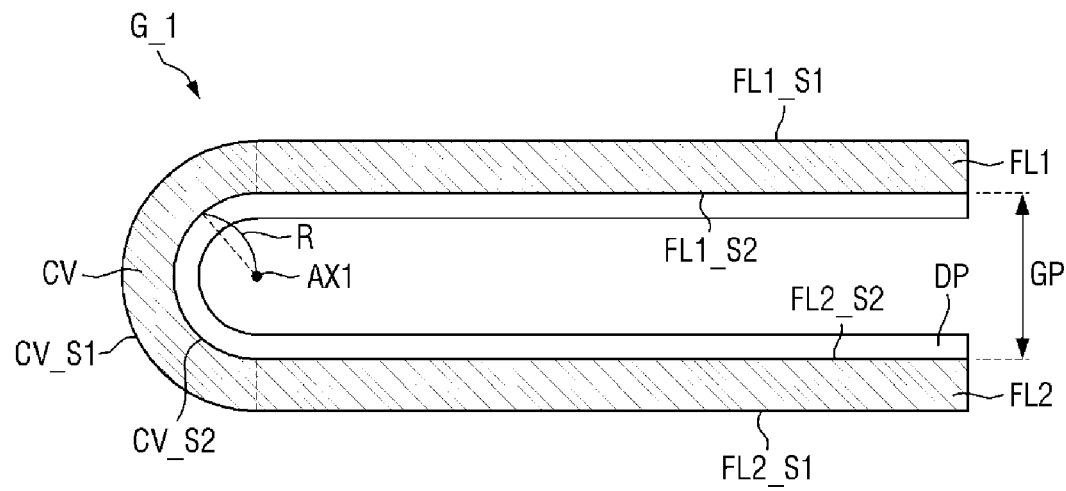
FIG. 3 is a cross-sectional view taken along line I-I' of FIG. 2.
Figure 4:
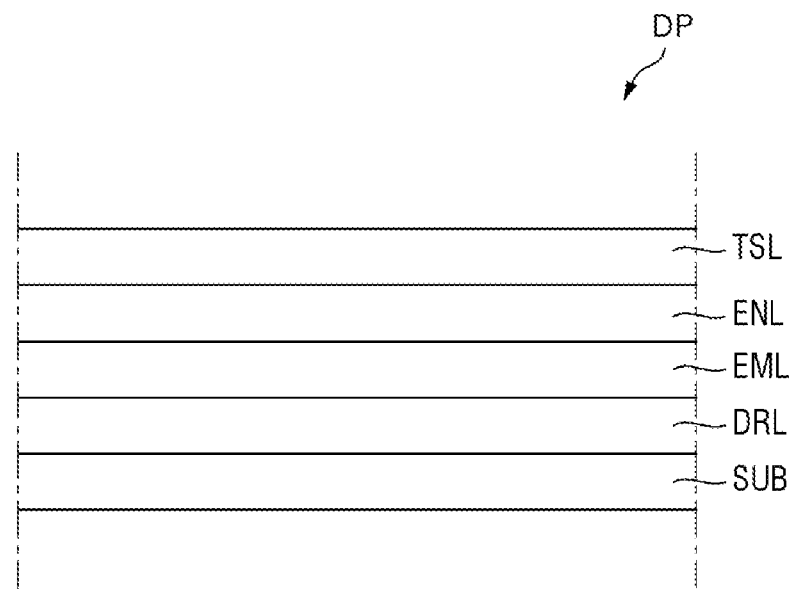
FIG. 4 is a cross-sectional view of the display panel of FIG. 3.
Figure 5:
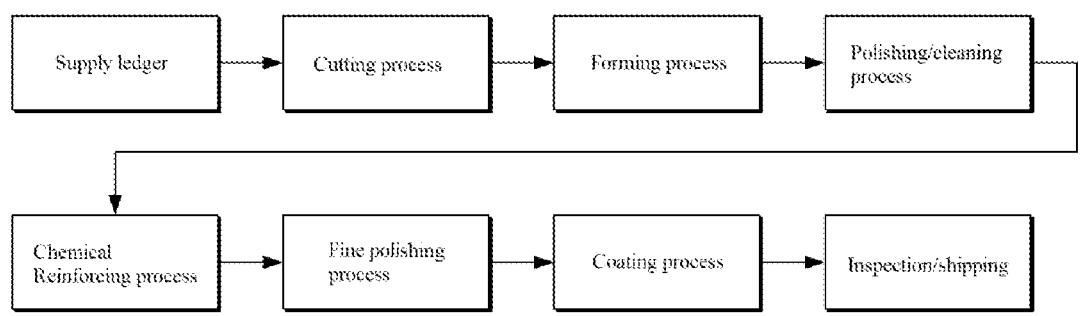
FIG. 5 is a flowchart of a process of manufacturing the glass product of FIG. 1 and to an embodiment of the invention.

FIG. 1 is a perspective view of glass products related to a glass manufacturing apparatus, FIG. 2 is a perspective view of a glass product to which a display panel is attached, FIG. 3 is a cross-sectional view taken along line I-I' of FIG. 2, FIG. 4 is a cross-sectional view of the display panel of FIG. 3, and FIG. 5 is a flowchart of a process of manufacturing the glass product of FIG. 1 according to an embodiment of the disclosure.

A glass product G may be used as a window for protecting display, a substrate for a display panel, a substrate for a touch panel, or an optical member such as a light guide plate. The glass product G may be used in various electronic devices such as tablet personal computers (PCs), notebook PCs, smart phones, e-books, televisions, PC monitors, refrigerators, and washing machines. Glass may be used in a cover for car dashboards, a cover for solar batteries, as an interior material for building materials, and a window for buildings or houses. The glass product G may be glass reinforced by a chemical reinforcing process to be described later.

Referring to FIG. 1, a planar shape of the glass product G may be rectangular, but is not limited thereto. For example, the glass product G may have various shapes such as a rectangle having rounded corners, a square having rounded corners, a circle, and an ellipse. For example, each of the corners of the glass product G may include a round portion having a curvature radius ranging from about 10 mm to about 12 mm. As shown in FIG. 1, the glass product G may be bent or folded such that a first part thereof faces a second other part thereof. Accordingly, the glass product G may have a U-shaped or C-shaped cross section.

The glass product G may have various shapes. For example, the glass product G may include a first glass product G_1, a second glass product G_2, or a third glass product G_3. Each of the glass products includes a first flat portion FL1 and a second flat portion FL2. In the first glass product G_1, a size of the first flat portion FL1 is the same as a size of the second flat portion FL2. In the second glass product G_2, a length of the first flat portion FL1 in a first direction is shorter than a length of the second flat portion FL2 in the first direction. In the third glass product G_3, a length of the first flat portion FL1 in a second other direction is shorter than the length of the second flat portion FL2 in the second direction. However, the shape of the glass product G is exemplary, and the shape of the glass product G is not limited to the above examples.

Hereinafter, for convenience of explanation, the glass product G_1 in which the first flat portion FL1 and the second flat portion FL2 have the same size as each other will be manly described, but characteristics of the glass product G_1 to be described later may be applied to any of the other glass products G_2 and G_3.

Referring to FIGS. 1 to 3, the glass product G_1 includes a first flat portion FL1, a second flat portion FL2, and a curved portion CV. The curved portion CV connects the first flat portion FL1 to the second flat portion FL2.

The first flat portion FL1 and the second flat portion FL2 may be disposed in parallel to each other. For example, the first flat portion FL1 and the second flat portion FL2 may be disposed in parallel to each other such that a gap GP between the first flat portion FL1 and the second flat portion FL2 is uniform. For example, distances between the first flat portion FL1 and the second flat portion FL2 in a plan view may be constant. In an embodiment, an angle formed by the first flat portion FL1 and the second flat portion FL2 is about 0°. In an embodiment, the first flat portion FL1 and the second flat portion FL2 are inclined with respect to each other at a non-zero acute angle. In this embodiment, a thickness of the gap GP between the first flat portion FL1 and the second flat portion FL2 may be varied. For example, a thickness of the gap GP between the first flat portion FL1 and the second flat portion FL2 may decrease or increase toward the curved portion CV. In an embodiment, a thickness of the gap GP between one side of the first flat portion FL1 connected to the curved portion CV and one side of the second flat portion FL2 connected to the curved portion CV is smaller or larger than a thickness of the gap GP between the end of the first flat portion FL1 and the end of the flat portion FL2. In an embodiment, the angle formed by the first flat portion FL1 and the second flat portion FL2 is more than 0° and less than 180°. In an embodiment, the angle formed by the first flat portion FL1 and the second flat portion FL2 is more than 0° and less than 90°. In an embodiment, the angle formed by the first flat portion FL1 and the second flat portion FL2 is more than 0° and less than 15°. In an embodiment, a difference between a thickness of the gap GP between one side of the first flat portion FL1 connected to the curved portion CV and one side of the second flat portion FL2 connected to the curved portion CV and a thickness of the gap GP between the end of the first flat portion FL1 and the end of the flat portion FL2 ranges from about 5 mm to about 10 mm.

The first flat portion FL1 and the second flat portion FL2 may completely or partially overlap each other in a thickness direction or in a plan view. The first flat portion FL1 and the second flat portion FL2 may have the same size or different sizes from each other.

In an embodiment, the length of the first flat portion FL1 and/or the second flat portion FL2 in a first direction is greater than or equal to the length thereof in a second other direction. For example, the length of the first flat portion FL1 and/or the second flat portion FL2 in one direction may range from about 70 mm to about 90 mm, and the length thereof in the other direction may range from about 60 mm to about 80 mm. Here, the first direction may be a direction crossing or orthogonal to a first axis AX1, and the second direction may be a direction parallel to the first axis AX1.

The curved portion CV connects one side of the first flat portion FL1 and one side of the second flat portion FL2. In an embodiment, the curved portion CV has a convex curvature in an outward direction. The curved portion CV may be bent to have a predetermined curvature radius based on the first axis AX1. In an embodiment, the curvature radius ranges from about 3 mm to about 5 mm. The length of each of the first flat portion FL1 and the second flat portion FL2 in the second direction may be greater than or equal to the outer diameter and/or inner diameter of the curved portion CV. In an embodiment, the length of each of the first flat portion FL1 and the second flat portion FL2 in the second direction is about 2 times or more the length of the outer diameter and/or inner diameter of the curved portion CV. In an embodiment, the length of each of the first flat portion FL1 and the second flat portion FL2 in the second direction is about 6 times or more the length of the outer diameter and/or inner diameter of the curved portion CV. The second direction may be a direction in which the first flat portion FL1 and/or the second flat portion FL2 extend from the end of the curved portion CV.

Referring to FIG. 3, the glass product G_1 includes an outer surface and an inner surface. In an embodiment, the outer surface has a convex shape or has a substantially convex shape as a whole, and the inner surface has a concave shape or a substantially concave shape as a whole. The inner surface may be a surface facing a space surrounded by the glass product G_1, and the outer surface may be a surface opposite to the inner surface. For example, the inner surface may face the gap GP. One or more portions of the inner surface may be disposed to face each other. The outer surface may constitute an exterior of the glass product G_1.

For example, as shown in FIG. 3, the outer surface of the glass product G_1 may include a convex surface CV_S1 of the curved portion CV, one surface FL1_S1 of the first flat portion FL1 connected to the convex surface CV_S1, and one surface FL2_S1 of the second flat portion FL2 connected to the convex surface CV_S1. The inner surface of the glass product G_1 may include a concave surface CV_S2 of the curved portion CV, the other surface FL1_S2 of the first flat portion FL1 connected to the concave surface CV_S2, and the other surface FL2_S2 of the second flat portion FL2 connected to the concave surface CV_S2.

The outer and inner surfaces may be defined differently from that shown in FIG. 3 in accordance with the shape of the glass product G_1. The outer surface may include a convex surface CV_S1 of the curved portion CV and a surface connected adjacent thereto, and the inner surface may include a concave surface CV_S2 of the curved portion CV and a surface connected adjacent thereto.

Referring to FIGS. 2 and 3, in an embodiment, a display panel DP is attached to the inner surface of the glass product G_1. The display panel DP is configured to display an image IM. The display panel DP has flexibility, and may thus be bent to correspond to the shape of the inner surface of the glass product G_1. In an embodiment, the display panel DP is a flexible display panel.

Examples of the display panel DP may include light receiving display panels such as a liquid crystal display panel (LCD) and an electrophoretic display panel (EPD) as well as self-light emitting display panels such as an organic light emitting display panel (OLED), an inorganic light emitting display panel (inorganic EL), a quantum dot light emitting display panel (QED), a micro LED display panel (micro-LED), a nano LED display panel (nano-LED), a plasma display panel (PDP), a field emission display panel (FED), and a cathode ray display panel (CRT).

Hereinafter, an organic light emitting display panel will be described as the display panel DP, and the organic light emitting display panel applied to an embodiment will be simply abbreviated as the display panel DP unless specified otherwise. However, embodiments of the invention are not limited to the organic light emitting display panel, and other display panels DP listed above or known in the art may be applied.

Referring to FIG. 4, the display panel DP includes a substrate SUB, a circuit driving layer DRL disposed on the substrate SUB, a light emitting layer EML disposed on the circuit driving layer DRL, an encapsulation layer ENL disposed on the light emitting layer EML, and a touch layer TSL disposed on the encapsulation layer ENL.

The substrate SUB may be a flexible substrate including a flexible polymer material such as polyimide. Accordingly, the display panel DP may be warped, bent, folded, or rolled. In some embodiments, the substrate SUB may include a plurality of sub-substrates overlapping in the thickness direction or in a plan view with a barrier layer therebetween. In this embodiment, each of the sub-substrates may be a flexible substrate.

The circuit driving layer DRL is disposed on the substrate SUB. The circuit driving layer DRL may include a circuit for driving the light emitting layer EML of a pixel. The circuit driving layer DRL may include a plurality of thin film transistors.

The light emitting layer EML is disposed on the circuit driving layer DRL. The light emitting layer EML may include an organic light emitting layer made of an organic compound that emits light by recombination of electrons and holes. The light emitting layer EML may emit light with various luminance according to a driving signal transmitted from the circuit driving layer DRL.

The encapsulation layer ENL is disposed on the light emitting layer EML. The encapsulation layer ENL may prevent the penetration of moisture and gases (e.g., air) into the light emitting layer EML. The encapsulation layer ENL may include an inorganic film or a laminated film of an inorganic film and an organic film.

The touch layer TSL is disposed on the encapsulation layer ENL. The touch layer TSL, which is a layer for recognizing a touch input, may function as a touch member (e.g., a touch sensing device). The touch layer TSL may include a plurality of sensing regions and a plurality of sensing electrodes for sensing the touch input.

As shown in FIG. 2, the display panel DP may be disposed over the first flat portion FL1, the second flat portion FL2, and the curved portion CV, and the display panel DP may transmit light through the glass product G_1 to display an image IM on at least one of the first flat portion FL1, the second flat portion FL2 and the curved portion CV of the glass product G_1.

Referring to FIGS. 1 and 5, the glass product G is subjected to a polishing process.

For example, as shown in FIG. 5, the glass product G may be manufactured by a ledger supply process. In an embodiment, the ledger supply process includes: supplying a large plate-shaped glass ledger; a cutting process of cutting the supplied glass ledger; a forming process of bending the cut glass; a polishing/cleaning process of polishing and cleaning the bent glass; a chemical reinforcing process of chemically reinforcing the glass through ion exchange (e.g., submerging the cleaned glass into a molten salt such as potassium nitrate); a fine polishing process of finely polishing the reinforced glass to adjust its size; a coating process of coating the polished glass with a printing layer to prevent fingerprints and/or reflection; and an inspecting and shipping process of inspecting and shipping the coated glass product. For example, the glass product may be discarded before reaching the shipping process if defects in the resulting glass product are discovered during the inspecting process. The cutting process may include chamfering the supplied glass ledger or forming grooves and/or a bevel in the supplied glass ledger. In some embodiments, at least one process of the above processes may be omitted, or at least one process may be added to the above processes. For example, the fine polishing process may be omitted.

In the polishing/cleaning process, the outer surface of the glass product G may be polished. In an embodiment, in the forming process, the glass product G is bent by heating a central region of the ledger corresponding to the curved portion CV of the glass product G. After the forming process, due to the shrinkage of the glass product G, the dimensional tolerance of the glass product G may increase. Therefore, a process of polishing the outer surface of the glass product G is used to adjust the dimensional tolerance as described above. The polishing process may be performed using a glass manufacturing apparatus and/or a glass manufacturing method, which will be described later with reference to FIGS. 6 to 25.

Figure 6:
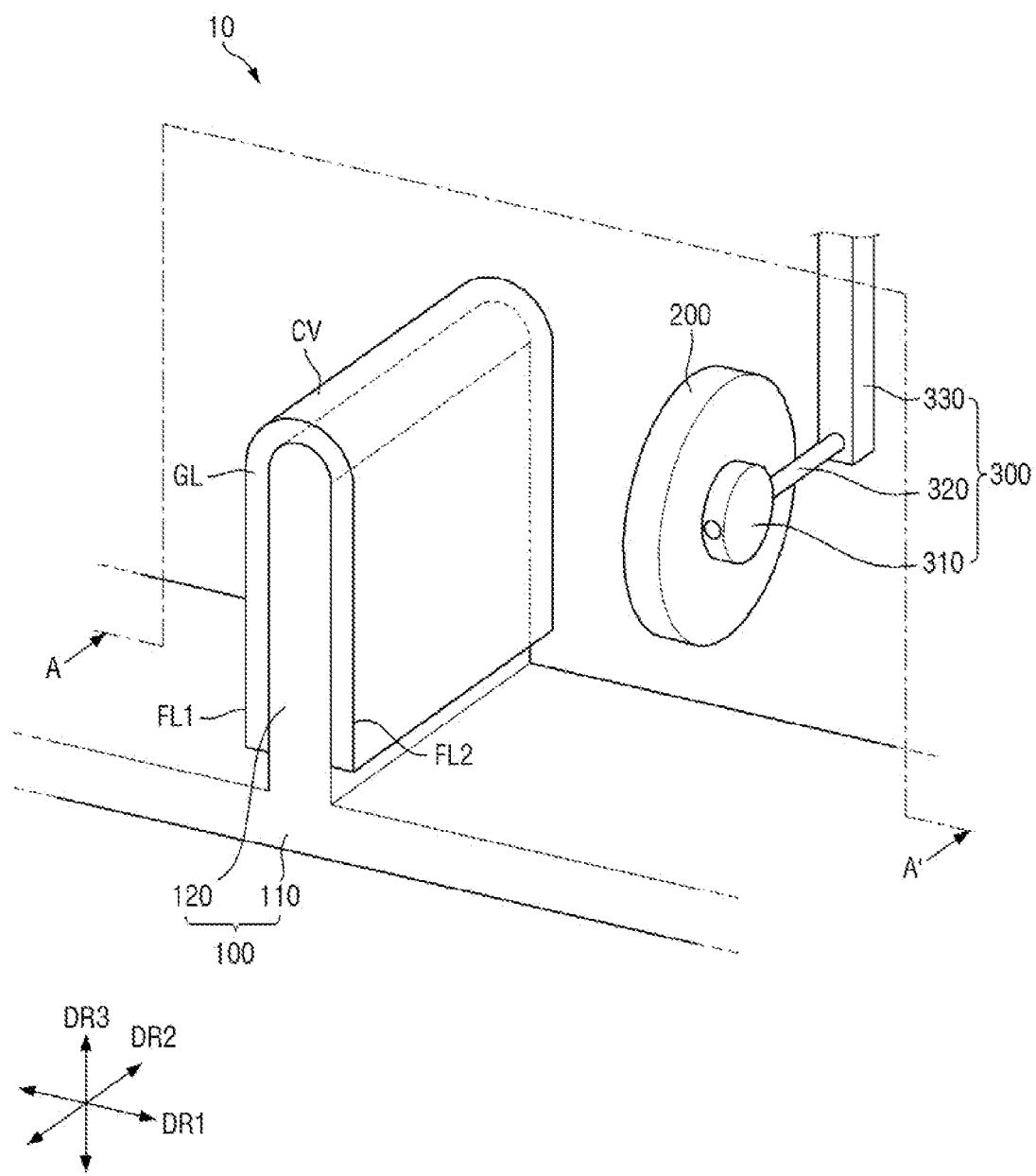
FIG. 6 is a perspective view of a glass manufacturing apparatus according to an embodiment of the invention.
Figure 7:
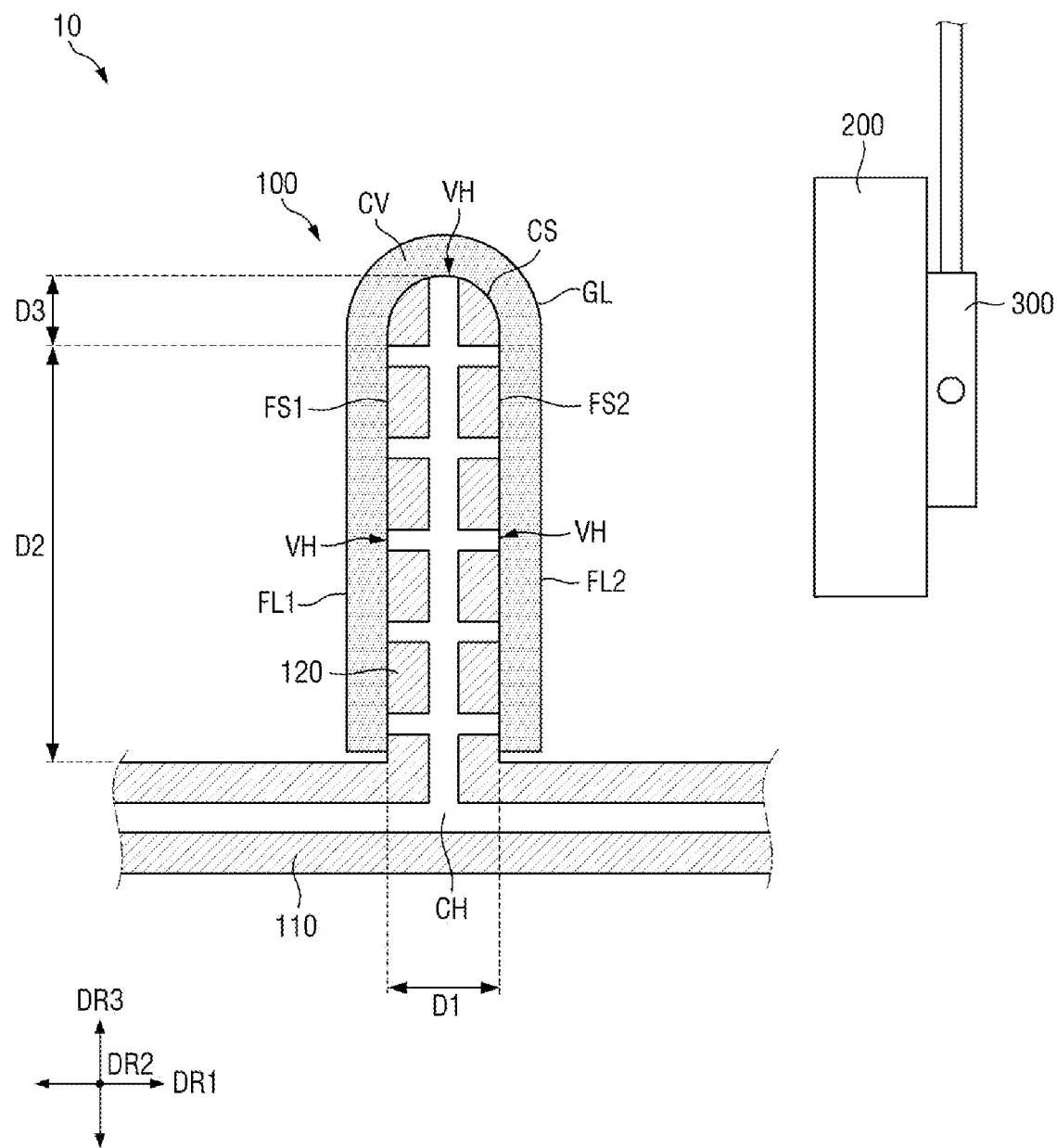
FIG. 7 is a cross-sectional view taken along line A-A' of FIG. 6.

FIG. 6 is a perspective view of a glass manufacturing apparatus according to an embodiment of the invention, and FIG. 7 is a cross-sectional view taken along line A-A' of FIG. 6.

Hereinafter, a first direction DR1, a second direction DR2, and a third direction DR3 illustrated in FIGS. 6 and 7 intersect in different directions from each other. The first direction DR1 may be a horizontal direction, the second direction DR2 may be a vertical direction, and the third direction DR3 may be a height direction (thickness direction). For example, in FIG. 7, the first direction DR1 is an X direction, the second direction DR2 is a Y direction, and the third direction DR3 is a Z direction. The first to third directions DR1 to DR3 may include two or more directions. For example, as shown in FIG. 6, the third direction DR3 may include an upper direction and a lower direction. Accordingly, one surface facing the upper direction of a member may be referred to as an upper surface, and the other surface facing the lower direction thereof may be referred to as a lower surface. However, the directions are exemplary, and the following embodiments are not limited to those mentioned above.

Hereinafter, an embodiment in which a support 100 for glass processing is included in a glass manufacturing apparatus 10 is exemplified. The glass manufacturing apparatus 10 may include a glass polishing apparatus. However, the support 100 for glass processing may be used in at least one process other than the polishing process, for example, a cutting process, a forming process, a polishing/cleaning process, a fine polishing process, and/or a coating process. The application of the support 100 for glass processing is not limited to the following embodiments, and may be used in combination with other apparatuses in addition to the glass manufacturing apparatus 10 or may be used independently.

The glass GL manufactured by the following glass manufacturing apparatus 10 may include the glass product G illustrated in FIG. 1, but the present invention is not limited thereto.

Referring to 6 and 7, the glass manufacturing apparatus 10 includes a support 100 (e.g., a stand) for processing glass. Hereinafter, for convenience of description, the support 100 for glass processing is abbreviated as the support 100.

At least a part of the support 100 is inserted into the inner space or the gap GP of the glass GL bent in a U-shape to hold the glass GL. The inner space of the glass GL may be a space in which at least two sides are surrounded by the bent glass GL. For example, the inner space may be a space or the gap GP between the first flat portion FL1 and the second flat portion FL2 of the glass GL. The support 100 may prevent the deformation and breakage of the glass GL during a polishing process of the glass GL.

In an embodiment, the support 100 includes a base 110 and a protrusion 120 protruding from the base 110.

The base 110 is placed on a surface such as the ground and supports the protrusion 120. The base 110 may include an upper surface and a lower surface parallel to the first direction DR1 and the second direction DR2. The protrusion 120 may be disposed on the upper surface, and the lower surface may be placed on the ground. A flow path CH to be described later may be formed inside the base 110. In an embodiment, the base 110 has a flat rectangular parallelepiped shape extending in the first direction DR1, but the shape thereof is not limited thereto. In some embodiments, the base 110 may be omitted or may be replaced with another configuration including, for example, at least one of a frame and/or a bracket capable of supporting the protrusion 120.

The protrusion 120 protrudes upward from the upper surface of the base 110. In an embodiment, the protrusion 120 has a substantially rectangular shape that is long in the second direction DR2 on a plane. The side surfaces of the protrusion 120 extending in the third direction DR3 may include a flat surface, and an end of the protrusion 120 may include a curved surface. A glass GL is mounted on the protrusion 120. In an embodiment, at least a part of the protrusion 120 is inserted between the first flat portion FL1 and second flat portion FL2 of the glass GL. Accordingly, the inner surface of the glass GL having an overall concave shape may be placed on the outer surface of the protrusion 120. The protrusion 120 may be inserted between the first flat portion FL1 and second flat portion FL2 of the glass GL to prevent deformation or damage of a product of the glass GL during a polishing process. In an embodiment of the invention, the height of the protrusion 120 is greater than or equal to the width D1 of the protrusion 120 in the first direction DR1. In an embodiment, the height of the protrusion 120 is two times or more the width D1 of the protrusion 120. In an embodiment, the width of the protrusion 120 in the second direction DR2 is the same as the width of the glass GL mounted thereon in the second direction DR2. Accordingly, edges of the protrusion 120 in the second direction DR2 may be aligned with edges of the glass GL in the second direction DR2, thereby facilitating the polishing of the edge portion of the glass GL, for example, the formation of a chamfer surface. In an embodiment, the width of the protrusion 120 in the second direction DR2 is the same as the width of the base 110 in the second direction DR2, but the present invention is not limited thereto. In some embodiments, a plurality of protrusions 120 may be disposed on one base 110.

In an embodiment, as shown in FIG. 7, the protrusion 120 includes a first flat surface FS1, a second flat surface FS2, and a curved surface CS.

The first flat surface FS1 and the second flat surface FS2 may be disposed on both side surfaces of the protrusion 120 extending in the third direction DR3, and the curved surface CS may be disposed on an end between the both side surfaces thereof. The first flat surface FS1, the second flat surface FS2, and the curved surface CS may have a shape corresponding to the inner surface of the glass GL. Specifically, the first flat surface FS1, the second flat surface FS2, and the curved surface CS may have shapes corresponding to the first flat portion FL1, the second flat portion FL2 and the curved portion CV of the glass GL, respectively.

The first flat surface FS1 and the second flat surface FS2 are disposed to face each other. The first flat surface FS1 and the second flat surface FS2 may extend flatly in the third direction DR3 from one edge and the other edge of the curved surface CS, respectively. In an embodiment, the first flat surface FS1 and the second flat surface FS2 are disposed to be parallel to each other. In this embodiment, the angle formed by the first flat surface FS1 and the second flat surface FS2 is about 0°, and the distance D1 between the first flat surface FS1 and the second flat surface FS2 in the first direction DR1 is uniform. For example, distances between the first flat surface FS1 and the second flat surface FS2 in the first direction DR1 may be constant. In some embodiments, the first flat surface FS1 and the second flat surface FS2 may be disposed to be inclined to each other. In one of these embodiments, the angle formed by the first flat surface FS1 and the second flat surface FS2 may be more than about 0° and less than 180°, and the distance D1 between the first flat surface FS1 and the second flat surface FS2 in the first direction DR1 may be variable. Specifically, the distance D1 between one side of the first flat surface FS1 connected to the curved surface CS and one side of the second flat surface FS2 connected thereto in the first direction DR1 may be different from the distance D1 between the other side of the first flat surface FS1 connected to the base 110 and the other side of the second flat surface FS connected thereto in the first direction DR1. For example, the distance between the first flat surface FS1 and the second flat surface FS2 in the first direction DR1 may decrease or increase as it approaches the end of the protrusion 120 where the curved surface CS is located. In another example, the difference between the distance between one side of the first flat surface FS1 connected to the curved surface CS and one side of the second flat surface FS2 connected to the curved surface CS in the first direction DR1 and the distance between the other side of the first flat surface FS1 connected to the base 110 and the other side of the second flat surface FS connected to the base 100 in the first direction DR1 may range from about 5 mm to about 10 mm. In an embodiment, at least a part of the first flat surface FS1 and the second flat surface FS2 is replaced with a curved surface.

The curved surface CS connects one side of the first flat surface FS1 and one side of the second flat surface FS2. The curved surface CS may have a shape corresponding to that of the curved portion CV of the glass GL. In an embodiment, the curved surface CS has a convex shape corresponding to the concave side surface of the curved portion CV of the glass GL. The curved surface CS may be curved to have a curvature radius corresponding to the curvature radius of the curved portion CV. For example, the curved surface CS may be curved to have a curvature radius ranging from about 3 mm to about 5 mm.

In an embodiment, the length D2 of each of the first flat surface FS1 and the second flat surface FS2 in the third direction DR3 is greater than the distance between the first flat surface FS1 and the second flat surface FS2 in the first direction DR1. The length D2 of each of the first flat surface FS1 and the second flat surface FS2 in the third direction DR3 may be a length from one side of the first flat surface FS1 connected to the curved surface CS to the end of the first flat surface FS1 or a length from one side of the second flat surface FS2 connected to the curved surface CS to the end of the second flat surface FS2. In an embodiment, the length D2 of each of the first flat surface FS1 and the second flat surface FS2 in the third direction DR3 is longer than the length of each of the first flat portion FL1 and the second flat portion FL2 of the glass GL in the third direction DR3. In an embodiment, only a part of the first flat surface FS1 and only a part of the second flat surface FS2 is covered by the first flat portion FL1 and the second flat portion FL2 of the glass GL, respectively. In this case, ends of the first flat portion FL1 and the second flat portion FL2 of the glass GL may be spaced apart from the upper surface of the base 110. In an embodiment, the length D2 of each of the first flat surface FS1 and the second flat surface FS2 in the third direction DR3 is 8 times or more the distance D1 between the first flat surface FS1 and the second flat surface FS2 in the first direction DR1. For example, the length D2 of each of the first flat surface FS1 and the second flat surface FS2 may be about 70 mm to about 100 mm.

The curved surface CS may protrude upward from one side of the first flat surface FS1 and one side of the second flat surface FS2. In an embodiment, the height D3 to which the curved surface CS protrudes in the third direction DR3 is smaller than the distance between the first flat surface FS1 and the second flat surface FS2 in the first direction DR1. In an embodiment, the height D3 to which the curved surface CS protrudes is substantially the same as the curvature radius of the curved surface CS. For example, the height D3 to which the curved surface CS protrudes may range from about 3 mm to 5 mm.

The curved surface CS may have a convex shape corresponding to the concave shape of the inner surface of the curved portion CV of the glass GL. In an embodiment, a center of a curvature of the curved surface CS is the same as the center of curvature of the curved portion CV of the glass GL. The curvature radius of the curved surface CS may be substantially the same as or similar to the curvature radius of the glass GL (R in FIG. 1). For example, the curvature radius of the curved surface CS may range from about 3 mm to about 5 mm. In an embodiment, the distance D1 between the first flat surface FS1 and the second flat surface FS2 in the first direction DR1 is two times the curvature radius of the curved surface CS. For example, the distance D1 between the first flat surface FS1 and the second flat surface FS2 may range from about 6 mm to about 10 mm.

In an embodiment of the invention, the support 100 further includes a vacuum hole VH provided in at least one of the first flat surface FS1, the second flat surface FS2, and the curved surface CS, and a flow path CH connected to the vacuum hole VH and penetrating the inside of the support 100.

In an embodiment, a plurality of vacuum holes VH are disposed at the first flat surface FS1, the second flat surface FS2, and the curved surface CS. In an embodiment, a vacuum hole VH is also provided on the curved surface CS, so that the curved portion CV of the glass GL may be in close contact with the curved surface CS. In an embodiment, the flow path CH is formed to penetrate the inside of the base 110 and the protrusion 120. Although not shown, the glass manufacturing apparatus 10 may further include a negative pressure forming means, such as a vacuum pump, connected to the flow path CH to form negative pressure or suction in the flow path CH. The protrusion 120 may include a hollow portion having multiple internal channels having exits at the vacuum holes VH and the base 110 may include a hollow portion with an exit hole adjacent to the hollow portion of the protrusion 120.

The glass manufacturing apparatus 10 may further include a polishing pad 200 and a polishing pad moving unit 300 connected to the polishing pad 200.

The polishing pad 200 is configured to polish the outer surface of the glass GL mounted on the support 100. The outer surface of the glass GL may be a surface facing the inner surface of the glass GL seated on the support 100. In an embodiment, the polishing pad 200 has a flat cylinder shape, and may include a plurality of base materials disposed on one side surface facing the support 100. The outer surface of the GL may be smoothed by application of the base materials using the polishing pad moving unit 100.

The polishing pad moving unit 300 moves and rotates the polishing pad 200 in at least one direction. In an embodiment, polishing pad moving unit 300 includes one or more motors that move the polishing pad 200 in a linear direction and/or rotate the polishing pad 200. The polishing pad moving unit 300 may move and rotate the polishing pad 200 in accordance with the shape of the outer surface of the glass GL. Detailed operations of the polishing pad moving unit 300 will be described in detail with reference to FIGS. 10 to 13.

Figure 10:
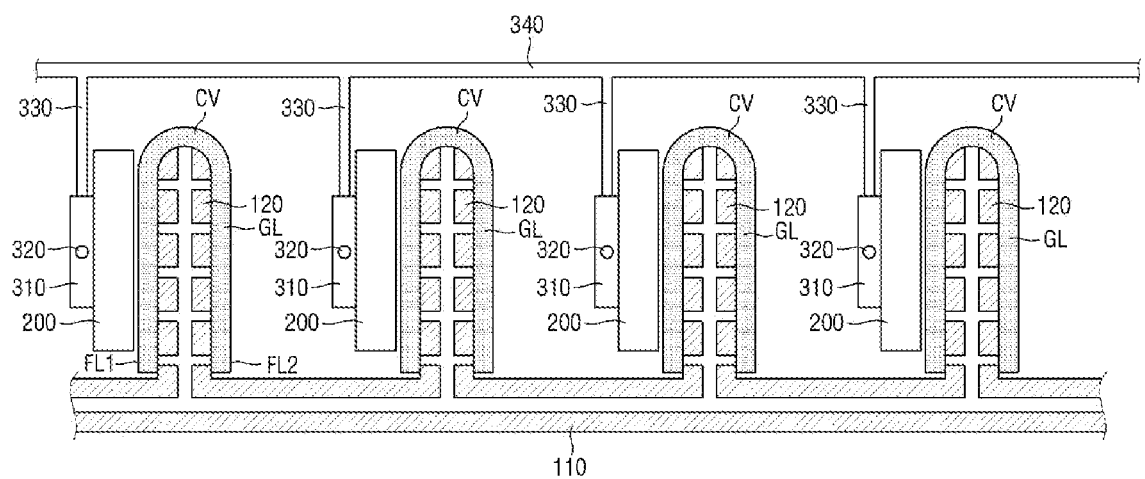

In an embodiment, as shown in FIG. 10, the polishing pad moving unit 300 includes a polishing pad coupling unit 310, a shaft 320, and a moving frame 330. The polishing pad coupling unit 310 is coupled to the other side surface of the polishing pad 200 and rotates with respect to the shaft 320. The shaft 320 is connected to the polishing pad coupling unit 310 and provides a rotation axis in the second direction DR2. The moving frame 330 is connected to the other end of the shaft 320 and moves in at least one direction. In some embodiments, although not shown, the polishing pad moving unit 300 may be implemented as a mechanical arm and be configured to move and rotate in a plurality of directions.

Figure 8:
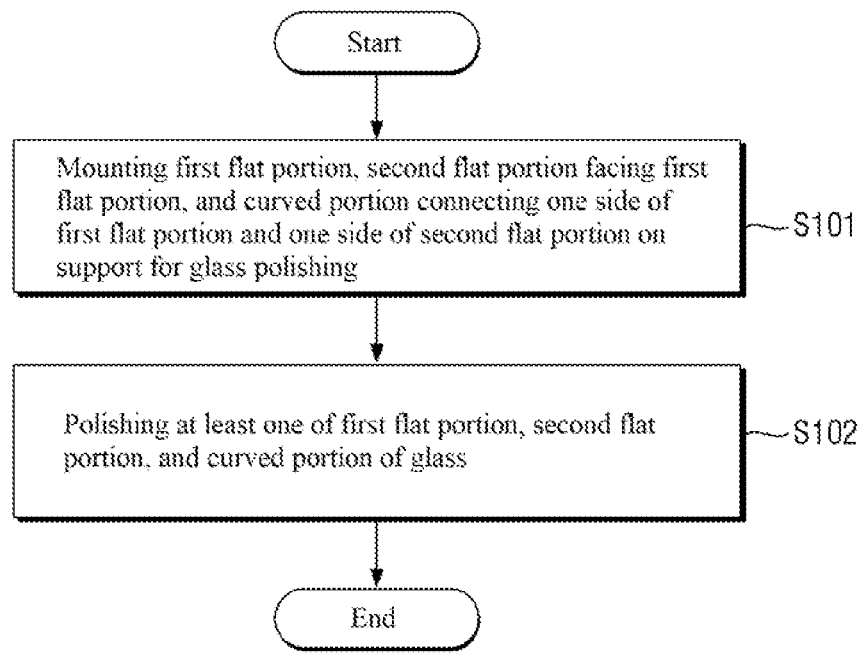
FIG. 8 is a flowchart of a glass manufacturing method according to an embodiment of the invention.

FIG. 8 is a flowchart of a glass manufacturing method according to an embodiment of the invention, and FIGS. 9 to 12 are views illustrating steps of the glass manufacturing method according to embodiments of the invention.

The glass manufacturing method according to an embodiment may be performed by the glass manufacturing apparatus 10 of FIG. 6.

Referring to FIG. 8, the glass manufacturing method includes mounting a glass GL on a support 100 for glass processing, the glass GL including a first flat portion FL1, a second flat portion FL2 facing the first flat portion FL1, and a curved portion CV connecting one side of the first flat portion FL1 and one side of the second flat portion FL2 (step S101). The glass manufacturing method of FIG. 8 further includes polishing at least one of the first flat portion FL1, the second flat portion FL2, and the curved portion of the glass GL (step 102).

The step of mounting the glass GL on the support 100 may include a step of inserting a protrusion 120 between the first flat portion FL1 and the second flat portion FL2 of the glass GL, the protrusion 120 including a first flat surface FS1, a second flat surface FS2, and a curved surface CS. For example, the glass GL may be inserted between a gap GP between the first flat portion FL1 and the second flat portion FL2 of the glass GL.

The step of polishing at least one of the first flat portion FL1, the second flat portion FL2, and the curved portion of the glass GL may include a step of moving and rotating a polishing pad 200 such that one side surface of the polishing pad 200 faces the first flat portion FL1, a step of moving and rotating the polishing pad 200 such that one side surface of the polishing pad 200 faces the second flat portion FL2, and a step of moving and rotating the polishing pad 200 according to the shape of the curved portion CV. In an embodiment, the polishing pad 200 is brought into direct contact with at least one of the first flat portion FL1, the second flat portion FL2, and the curved portion CV during the moving and/or rotating.

The glass manufacturing method is not limited to the above embodiment, and at least some of the steps may be omitted, or at least one step may be further included with reference to FIGS. 6 and 7.

Hereinafter, a glass manufacturing method will be described in detail with reference to FIGS. 9 to 12 according to an embodiment of the invention.

Figure 9:
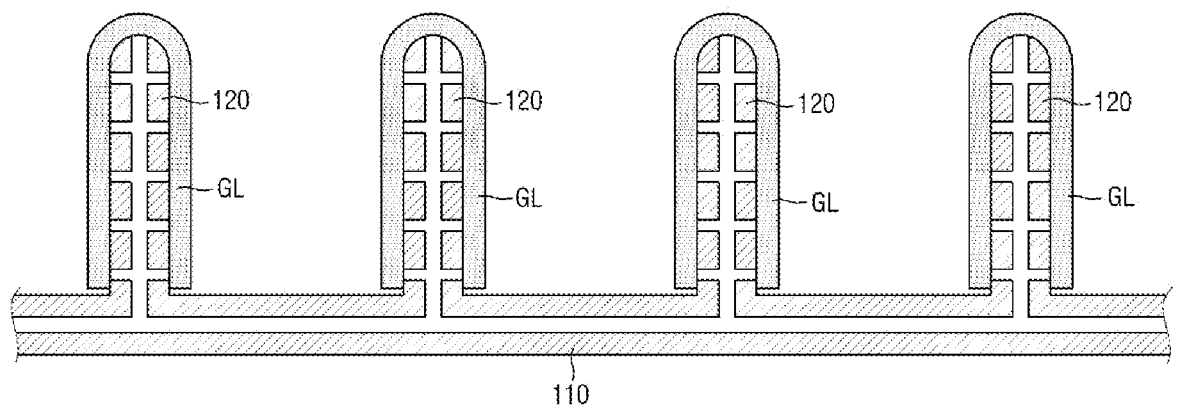
FIGS. 9 to 12 are views illustrating steps of the glass manufacturing method according to an embodiment of the invention.

Referring to FIG. 9, a glass GL including a first flat portion FL1, a second flat portion FL2, and a curved portion CV is mounted on a support 100. In an embodiment, a glass GL is mounted on each of a plurality of protrusions 120 protruding from a base 110. Specifically, the protrusion 120 is inserted between the first flat portion FL1 and second flat portion FL2 of the glass GL, and the first flat portion FL1, the second flat portion FL2, and the curved portion CV are mounted on a first flat surface FS1, a second flat surface FS2, and a curved surface CS, respectively. The glass GL may be adsorbed by a vacuum hole VH connected to a flow path CH penetrating the base 110 and the plurality of protrusions 120 to be in close contact with the outer surface of the protrusion 120. For example, a vacuum can be used to apply sufficient suction to the vacuum holes VH so that each glass GL is held tightly against a respective one of the protrusions 120. Although FIG. 9 illustrates the plurality of protrusions 120 protruding from the base 110, in some embodiments, a plurality of mutually separated supports 100 may be sequentially arranged.

Referring to FIG. 10, after the glass GL is mounted, the first flat portion FL1 of the glass GL is polished. Specifically, the polishing pad 200 may be moved to one side of the protrusion 120 by the polishing pad moving unit 300 to polish the first flat portion FL1 of the glass GL. In an embodiment, the polishing pad moving unit 300 moves and rotates the polishing pad 200 such that one side surface of the polishing pad 200 faces the first flat surface FS1 on which the first flat portion FL1 of the glass GL is placed. In an embodiment, the size of one side surface of the polishing pad 200 is smaller than the size of the first flat surface FS1 and/or the second flat surface FS2. In an embodiment, the size of one side surface of the polishing pad 200 is larger than the size of the first flat surface FS1 and/or the second flat surface FS2. The size of one side surface of the polishing pad 200 includes a diameter, and the size of the first flat surface FS1 and/or the second flat surface FS2 includes a length in the third direction DR3.

Referring to FIGS. 6 and 10, the polishing pad 200 rotates about an axis in the second direction DR2 such that one side thereof is parallel to the first flat portion FL1 extending in the vertical direction, and is placed in a vertical direction. The axis may be provided by a shaft 320 connected to the polishing pad 200. Subsequently, the polishing pad 200 may be moved by the polishing pad moving unit 300 such that one side of the polishing pad 200 is brough into close contact with the outer surface of the first flat portion FL1 of the glass GL.

When a plurality of protrusions 120 are disposed, the polishing pad 200 may be vertically placed and then inserted between the plurality of protrusions 120. In an embodiment of the invention, the distance between the plurality of protrusions 120 is greater than or equal to the thickness of one side surface of the polishing pad 200 in close contact with the glass GL and the other side surface opposite to the one side surface. The plurality of protrusions 120 are arranged such that the first flat surface FS1 of any one protrusion 120 and the second flat surface FS2 of another protrusion 120 adjacent to the one protrusion 120 face each other, but the distance between the plurality of protrusions 120 may be a distance between the first flat surface FS1 of any one protrusion 120 and the second flat surface FS2 of another protrusion 120 adjacent to the one protrusion 120. In an embodiment, the distance between the plurality of protrusions 120 is greater than or equal to the radius of the polishing pad 200. In an embodiment, one side surface of the polishing pad 200 in contact with the glass GL has a circular shape, and the distance between the plurality of protrusions 120 is greater than or equal to the radius of one side surface of the polishing pad 200.

Then, the polishing pad 200 may rotate about an axis perpendicular to the outer surface of the first flat portion FL1 to polish the outer surface of the first flat portion FL1. In some embodiments, the second flat portion FL2 and/or the curved portion CV of the glass GL may be polished first.

Figure 11:
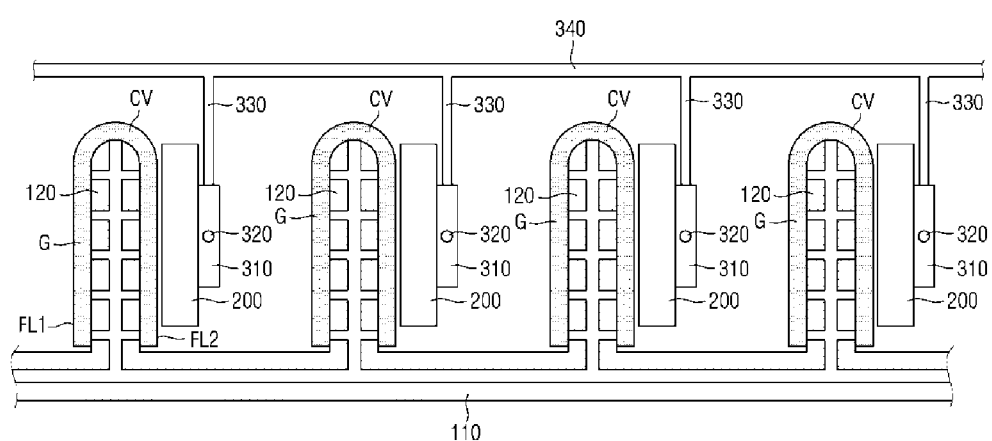

Referring to FIG. 11, after the first flat portion FL1 of the glass GL is polished, the second flat portion FL2 of the glass GL is polished. In an embodiment, the polishing pad 200 is moved to the other side of the protrusion 120 by the polishing pad moving unit 300 and polishes the second flat portion FL2 of the glass GL. In an embodiment, the polishing pad moving unit 300 moves and rotates the polishing pad 200 such that one side surface of the polishing pad 200 faces the second flat surface FS2 on which the second flat portion FL2 of the glass GL is placed. In an embodiment, referring to FIGS. 6 and 10, the polishing pad 200 moves in the first direction DR1, or rotates about 180° with respect to an axis in the second direction DR2 such that one side surface of the polishing pad 200 is inverted. Similar to the embodiment of FIG. 10, the polishing pad 200 may be inserted between the plurality of protrusions 120.

Figure 12:
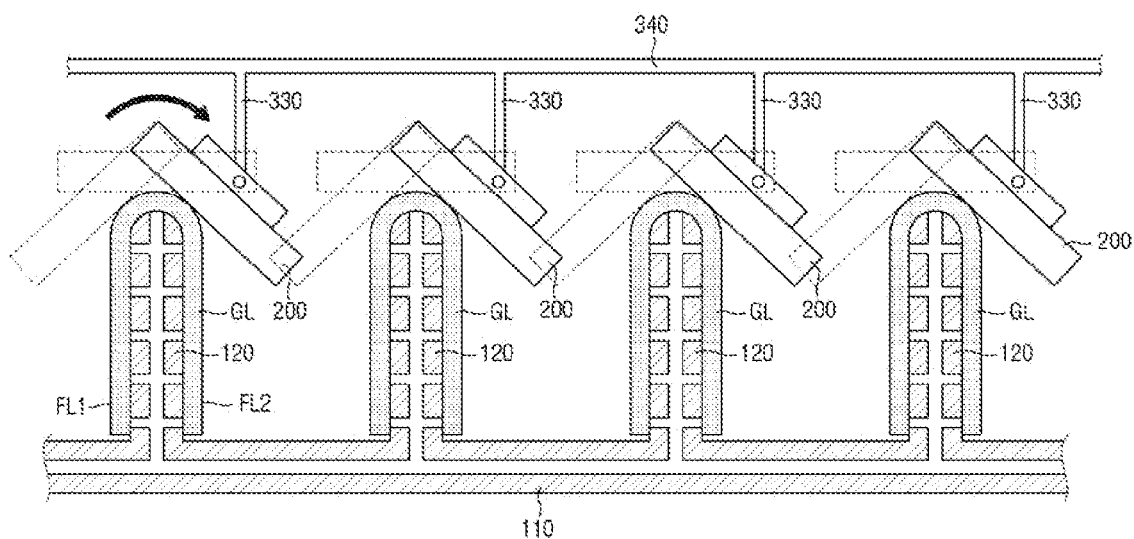

Referring to FIG. 12, after the second flat portion FL2 of the glass GL is polished, the curved portion CV of the glass GL is polished. In an embodiment, the polishing pad 200 is moved upward to the protrusion 120 by the polishing pad moving unit 300 and rotated to polish the curved portion CV of the glass GL. In an embodiment, the polishing pad moving unit 300 moves and rotates the polishing pad 200 such that one side surface of the polishing pad 200 faces the curved surface CS on which the curved portion CV of the glass GL is placed. In this embodiment, the polishing pad moving unit 300 moves and rotates the polishing pad 200 such that one side surface of the polishing pad 200 is in close contact with the curved portion CV in accordance with the convex shape of the curved portion CV. For example, as shown in FIG. 12, the polishing pad moving unit 300 moves and/or rotates the polishing pad 200 such that the polishing pad 200 is parallel to the tangential direction of one side of the curved portion CV. After the polishing pad 200 is sufficiently in close contact with the curved portion (CV), the polishing pad moving unit 300 rotates the polishing pad 200 clockwise by about 90° in accordance with the shape of the curved portion CV, and simultaneously may move in a vertical direction and/or a horizontal direction.

After polishing the curved portion CV, the glass GL may be removed from the support 100 since the polishing process of the glass GL has completed. In some embodiments, after polishing the curved portion CV, the cleaning and/or etching process of the glass GL is performed while the glass GL remains mounted on the support 100. The support 100 may be made of various materials such plastic or wood.

Figure 13:
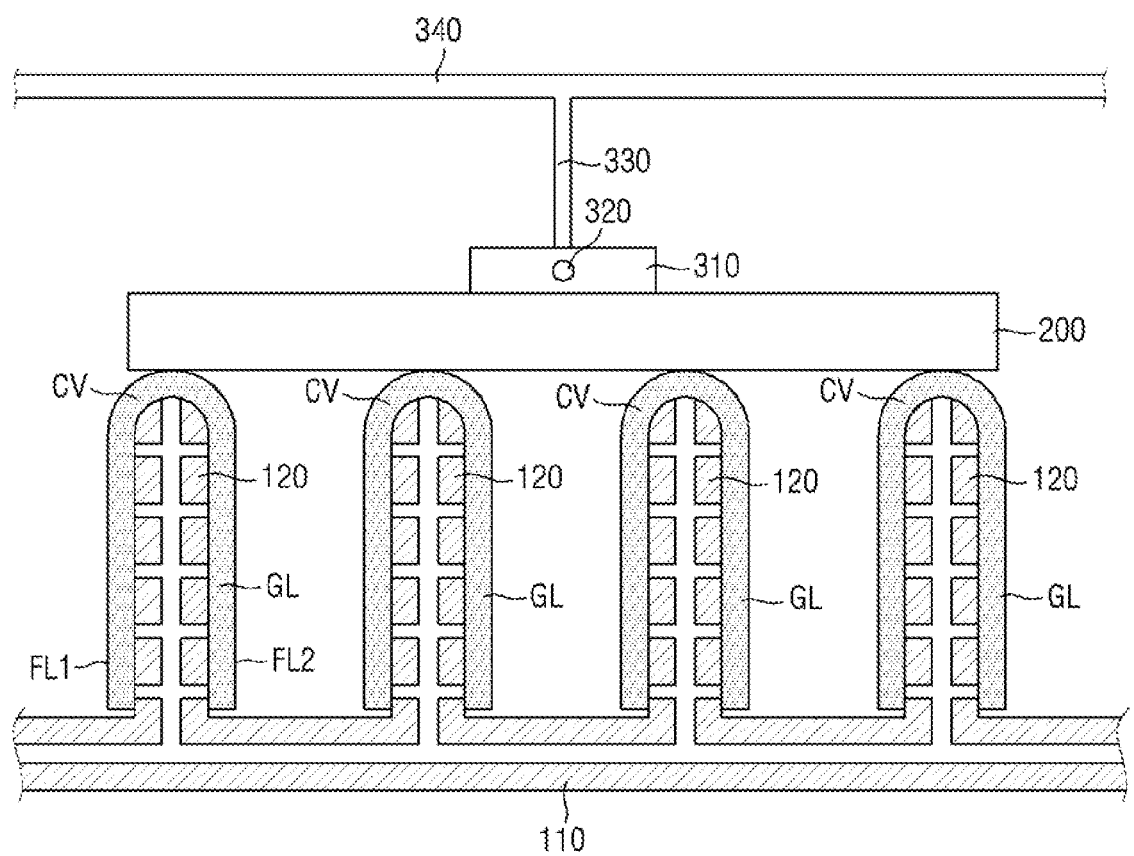
FIG. 13 is a view illustrating a glass manufacturing method according to an embodiment of the invention.

FIG. 13 is a view illustrating a glass manufacturing method according to an embodiment of the invention.

The embodiment of FIG. 13 is different from the embodiment of FIG. 12 in that the polishing of the curved portion CV is performed by one polishing pad 200.

Referring to FIG. 13, the glass manufacturing method according to an embodiment includes a step of polishing a plurality of curved portions CV using one polishing pad.

Referring to FIGS. 9 to 11 and 13, after polishing the second flat portion FL2, the polishing pad 200 polishes the plurality of curved portions CV. In an embodiment, the polishing pad moving unit 300 moves the polishing pad 200 upwards to the plurality of protrusions 120 such that the polishing pad 200 is mounted on the curved portions CV of the plurality of glasses GL. In this embodiment, the distance between the plurality of protrusions 120 is more than or equal to the thickness of the polishing pad 200 and is less than or equal to the radius of the polishing pad 200. In some embodiments, the polishing pad 200 may be a polishing pad different from the polishing pad 200 of FIG. 12. For example, the first flat portion FL1 and second flat portion FL2 of the glass GL may be polished by a first polishing pad, and the curved portion of the glass GL may be polished by a second polishing pad larger than the first polishing pad.

Since the embodiment of FIG. 13 is substantially the same as or similar to the embodiments of FIGS. 9 to 11 except for the polishing of the curved portion CV, redundant descriptions will be omitted.

Figure 14:
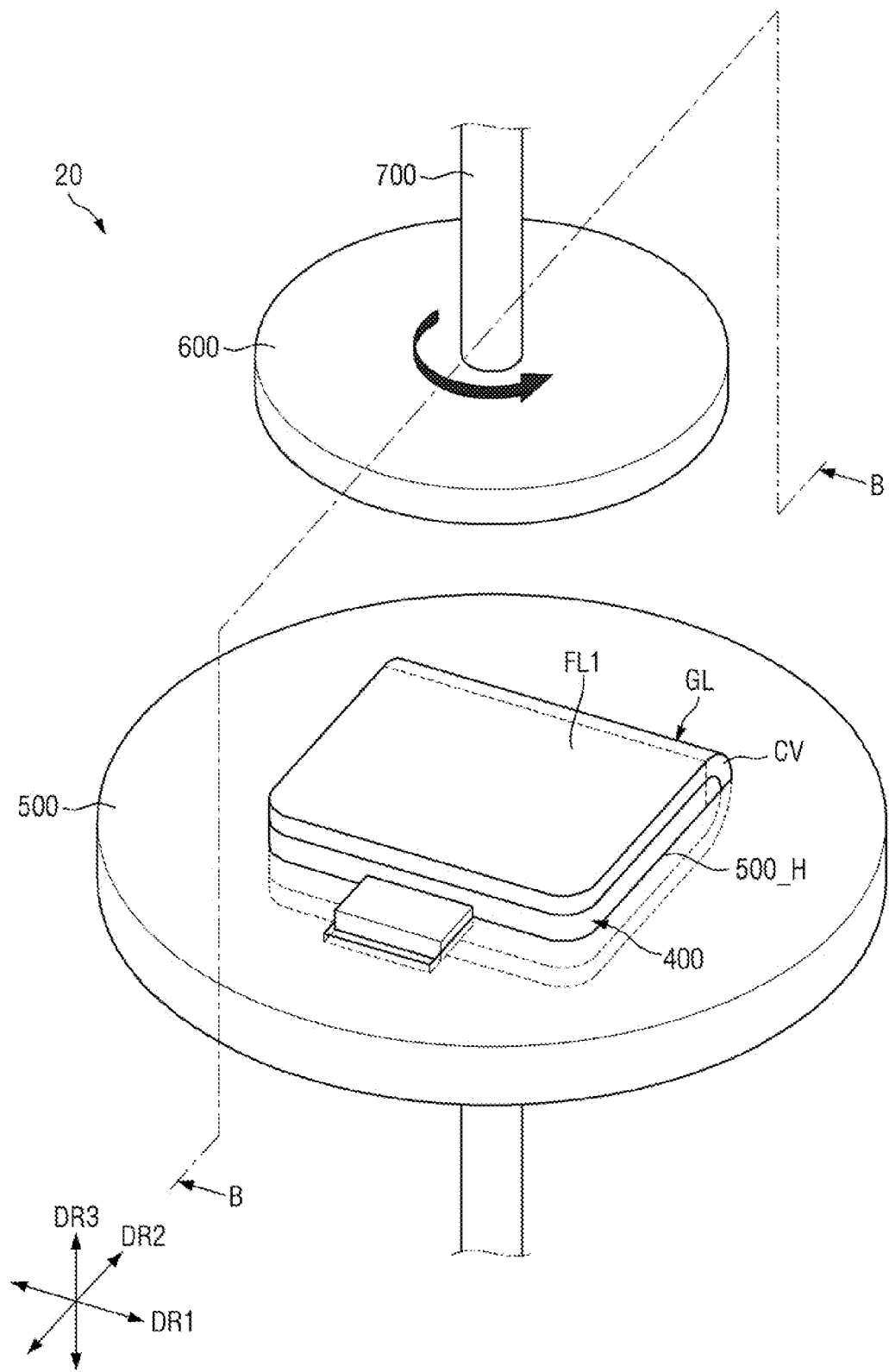
FIG. 14 is a perspective view of a glass manufacturing apparatus according to an embodiment of the invention.
Figure 15:
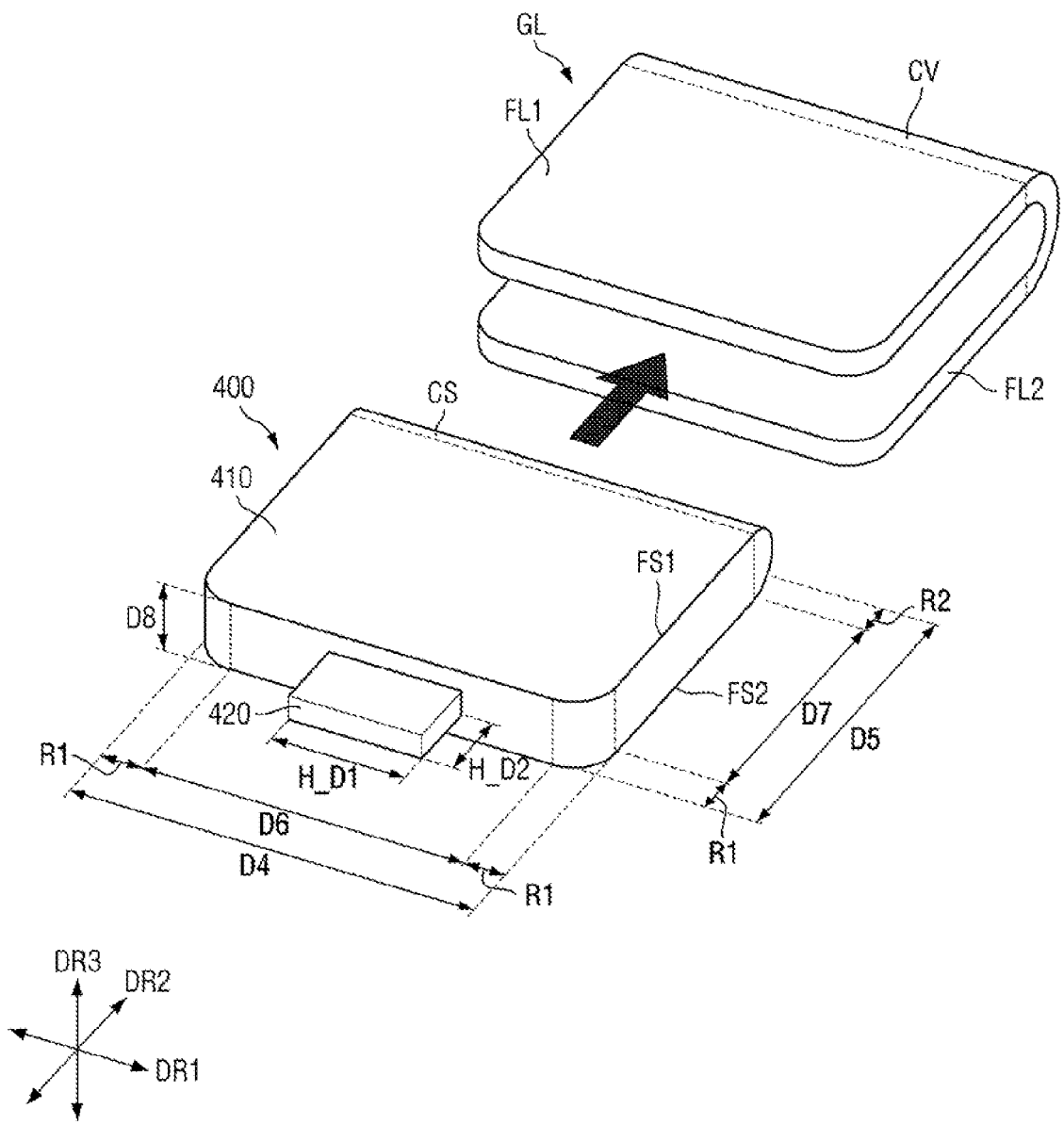
FIG. 15 is a perspective view of a glass processing jig of a glass manufacturing apparatus according to an embodiment of the invention.
Figure 16:
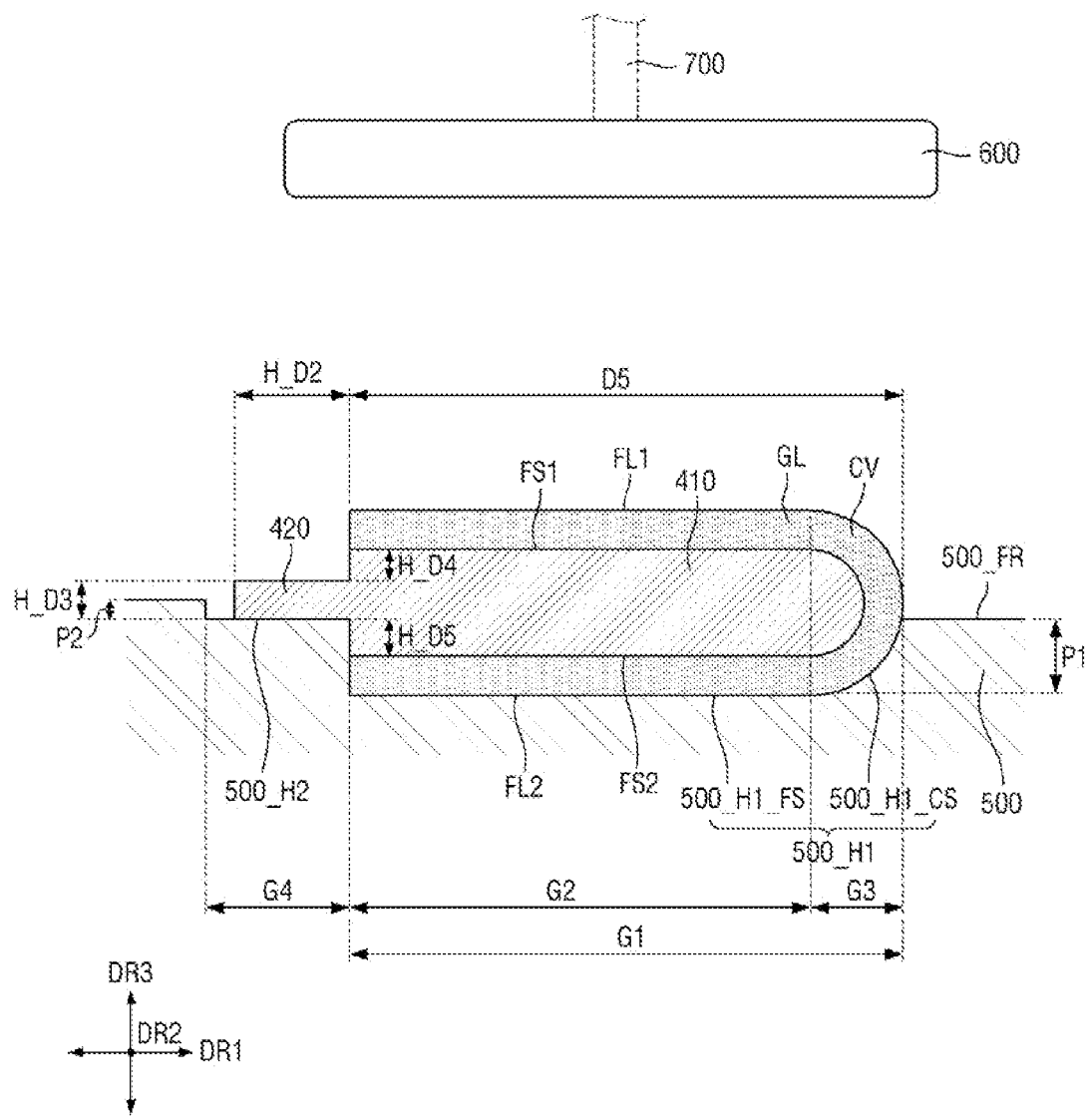
FIG. 16 is a cross-sectional view taken along line B-B' of FIG. 15.

FIG. 14 is a perspective view of a glass manufacturing apparatus according to an embodiment, FIG. 15 is a perspective view of a glass processing jig of the glass manufacturing apparatus according to an embodiment, and FIG. 16 is a cross-sectional view taken along line B-B' of FIG. 15.

Hereinafter, an embodiment in which a jig 400 for glass processing is included in a glass manufacturing apparatus 20 is exemplified. The jig 400 may be made from various materials such as glass or plastic. However, the jig 400 for glass processing may be used in at least one process other than the polishing process, for example, a cutting process, a forming process, a polishing/cleaning process, a fine polishing process, and/or a coating process. The application of the jig 400 for glass processing is not limited to the following embodiments, and may be used in combination with other apparatuses in addition to the glass manufacturing apparatus 20 or may be used independently. In some embodiments, the jig 400 for glass processing may be configured to be portable.

Referring to FIGS. 14 to 16, the glass manufacturing apparatus 20 includes a jig 400 for processing glass. Hereinafter, for convenience of description, the jig 400 for glass processing is abbreviated as the jig 400.

The jig 400 may be inserted into an inner space or gap GP of the glass GL bent in a U-shape. The inner space of the glass GL may be a space in which at least two sides are surrounded by the bent glass GL. For example, the inner space may be a space between the first flat portion FL1 and second flat portion FL2 of the glass GL. The jig 400 may prevent the deformation and breakage of the glass GL during a polishing process of the glass GL. The jig 400 may be placed into a groove 500_H of a stage 500 of FIG. 14.

The jig 400 may have a shape corresponding to the inner surface of the glass GL. In an embodiment, the jig 400 includes a body portion 410 having a flat rectangular parallelepiped shape having an upper surface, a lower surface, and four side surfaces. In an embodiment, the length D4 of the jig 400 in the first direction DR1 and the length D5 of the jig 400 in the second direction DR2 range from about 65 mm to about 85 mm, respectively, and the height D8 of the jig 400 in the third direction DR3 ranges from about 6 mm to about 10 mm. On the plane, the corners of the jig 400 may be rounded to have an outwardly convex shape. In an embodiment, both corners of the jig 400 connected to one side surface facing the curved surface CS to be described later may be curved to have an outwardly convex shape. In an embodiment, a curvature radius R1 of both corners of the jig 400 ranges from about 10 mm to about 12 mm. In an embodiment, the length D6 of a linear edge between the two corners ranges from about 45 mm to about 55 mm. In an embodiment, the distance D7 between one of both corners and the curved surface CS in the second direction DR2 ranges from about 55 mm to about 65 mm.

In an embodiment, the jig 400 include a first flat surface FS1, a second flat surface FS2, and a curved surface CS.

The first flat surface FS1 and the second flat surface FS2 may be disposed on the upper and lower surfaces of the body portion 410 of the jig 400, respectively, and the curved surface CS may be disposed on one side surface of the body portion 410 between the upper and lower surfaces. The first flat surface FS1, the second flat surface FS2, and the curved surface CS may have a shape corresponding to the inner surface of the glass GL. The first flat surface FS1, the second flat surface FS2, and the curved surface CS may have shapes corresponding to the first flat portion FL1, the second flat portion FL2 and the curved portion CV of the glass GL, respectively.

The first flat surface FS1 and the second flat surface FS2 are disposed to face each other. The first flat surface FS1 and the second flat surface FS2 may extend flatly in the third direction DR3 from one side and the other side of the curved surface CS, respectively. In an embodiment, the first flat surface FS1 and the second flat surface FS2 are disposed to be parallel to each other and to face one another. In an embodiment, the first flat surface FS1 and the second flat surface FS2 are disposed to be inclined to each other. For example, the angle formed by the first flat surface FS1 and the second flat surface FS2 may range from about 0° to about 90°.

The curved surface CS connects one side of the first flat surface FS1 and one side of the second flat surface FS2. The curved surface CS may have a shape corresponding to that of the curved portion CV of the glass GL. In an embodiment, the curved surface CS may have a convex shape corresponding to the concave side surface of the curved portion CV of the glass GL. The curved surface CS may be curved to have a curvature radius R2 corresponding to the curvature radius of the curved portion CV. In an embodiment, the curved surface CS is curved to have a curvature radius R2 ranging from about 3 mm to about 5 mm.

Each of the first flat surface FS1, the second flat surface FS2, and the curved surface CS may have the same size as the inner surface of the glass GL disposed over the first flat portion FL1, the second flat portion FL2, and the curved portion CV. The size may include length and/or area.

On a plane, outer edges of the jig 400 may be aligned with edges of the glass GL. That is, the outer edges of the jig 400 may overlap the edges of the glass GL in a thickness direction or in a plan view such that they do not protrude toward the outside of the glass GL on the plane. In an embodiment, the outer edges of the first flat surface FS1, the second flat surface FS2, and the curved surface CS are aligned with the outer edges of the first flat portion FL1, the second flat portion FL2, and the curved portion of the glass GL.

In an embodiment, the jig 400 further includes a handle portion 420 disposed on at least one side surface between the first flat surface FS1 and the second flat surface FS2.

The handle portion 420 may be disposed on one side surface of the jig 400 that faces or opposes the curved surface CS and extends in the first direction DR1. In an embodiment, the handle portion 420 is disposed to protrude from the curved surface CS. In an embodiment, the length H_D2 of the handle portion 420 in the first direction DR1 is smaller than the length D5 of the body portion 410 in the second direction DR2, and the width H_D1 of the handle portion 420 in the first direction DR1 is smaller than the length D4 of the jig 400 in the first direction DR1. The handle portion 420 may be disposed to be spaced apart from the first flat surface FS1 and the second flat surface FS2. In an embodiment, the thickness of the handle portion 420 in the third direction DR3 is smaller than the thickness of the jig 400 in the third direction DR3. Accordingly, the upper and lower surfaces of the handle portion 420 may be spaced apart from the first flat surface FS1 and the second flat surface FS2 in the third direction DR3.

As shown in FIG. 16, in an embodiment, the glass manufacturing apparatus 20 further includes a stage 500, a polishing pad 600, and a polishing pad moving unit 700.

The stage 500 may provide a space in which the jig 400 is placed. In an embodiment, the stage 500 is disposed to face the polishing pad 600, and may include a flat upper surface and a receiving groove 500_H disposed on the upper surface to accommodate the glass GL and the jig 400 is inserted into the receiving groove 500_H. In an embodiment, the receiving groove 500_H includes a first groove 500_H1 accommodating the first flat surface FS1 and a part of the curved surface CS (the second surface FS2 and the other part of the curved surface CS) of the jig 400, and a second groove 500_H2 connected to the first groove 500_H1 and accommodating the handle portion 420. In an embodiment, the size of the second groove 500_H2 is smaller than the size of the first groove 500_H1.

The first groove 500_H1 includes a first surface 500_H1_FS flatly extending to have a shape corresponding to the first flat portion FL1 and/or the second flat portion FL2 of the glass GL, and a second surface 500_H1_CS curved to have a shape corresponding to at least a part of the curved portion CV.

In an embodiment, the depth P1 of the first groove 500_H1 in the third direction DR3 is one-half or more of the sum of the thicknesses D8 of the first flat portion FL1, the second flat portion FL2 and the body portion 410 in the third direction DR3. In an embodiment, the depth P2 of the second groove 500_H2 in the third direction DR3 is one-half or more of the thickness H_D3 of the handle portion 420. In an embodiment, an edge of the second groove 500_H2 is spaced apart from the body portion 410 by a distance G4. In an embodiment, the depth P2 of the second groove 500_H2 is smaller than the depth P1 of the first groove 500_H1. In an embodiment, a part of the jig 400 fits within the first groove 500_H1 and the second groove 500_H2, but the other part of the jig 400 protrudes from the upper surface of the stage 500 in the third direction DR3. Accordingly, upper surfaces of the first flat surface FS1 and a part of the curved surface CS of the jig 400 (the second flat surface FS2 and the other part of the curved surface CS) may be exposed to face the polishing pad 600. In some embodiments, the jig 400 may be placed within the receiving groove such that only upper surfaces of the first flat portion FL1 or the second flat portion FL2 of the glass GL protrudes based on the upper surface of the stage 500. In an embodiment, the depth P2 of the second groove 500_H2 is greater than or equal to the thickness of the handle portion 420.

In an embodiment, the length G1 of the first groove 500_H1 in the second direction DR2 is equal to or greater than the sum of the thickness of the curved portion CV and the length D5 of the body portion 410 in the second direction DR2. In an embodiment, the length G1 of the jig 400 in the first direction DR1 is the sum of the length G2 of the first flat surface FS1 (the second flat surface FS2) in the first direction DR1 and the length G3 of the curved surface CS protruding in the second direction in the first direction DR1. In an embodiment, the length G1 of the first groove 500_H1 in the first direction DR1 is the same as the length D5 of the jig 400 in the first direction DR1.

The polishing pad 600 may be disposed above the stage 500. The polishing pad 600 may be disposed to face the receiving groove 500_H of the stage 500. In an embodiment, the size of the polishing pad 600 is larger than the size of the receiving groove 500_H. In an embodiment, the polishing pad 600 has a flat cylinder shape. In an embodiment, a diameter of the cylinder of the flat cylinder shape is larger than the size of the receiving groove 500_H. The polishing pad 600 may be in close contact with the glass GL by the polishing pad moving unit 700, and may rotate about an axis in the third direction DR3 to polish the outer surface of the glass GL.

The polishing pad moving unit 700 is connected to the polishing pad 600 and moves the polishing pad 600 in at least one direction. For example, the polishing pad moving unit 700 may move the polishing pad 600 downwards to bring the polishing pad 600 into close contact with the glass GL. Although not shown, the polishing pad moving unit 700 may include a mechanical arm to move the polishing pad 600 in at least one direction. The polishing pad moving unit 700 may include one or more motors to move the polishing pad 600.

Figure 17:
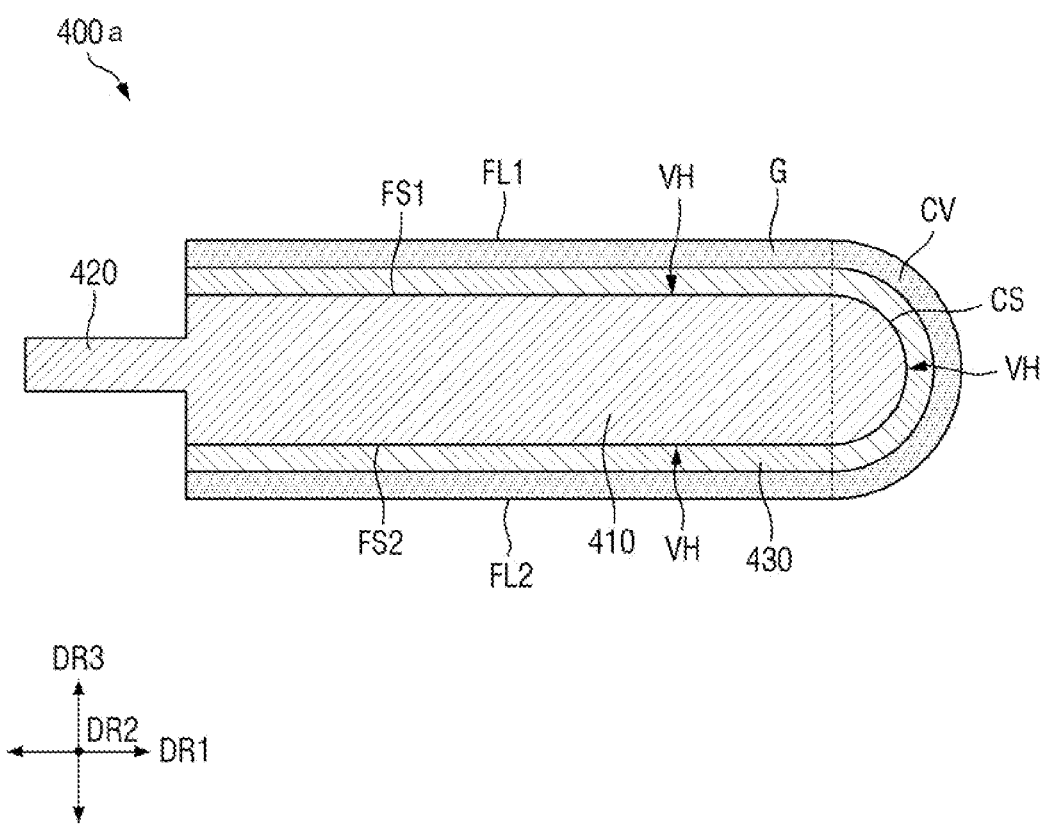
FIG. 17 is a cross-sectional view of a jig for glass processing according to an embodiment of the invention.

FIG. 17 is a cross-sectional view of a jig for glass processing according to an embodiment of the invention. The embodiment of FIG. 17 is different from the embodiment of FIG. 15 in that a jig 400a further includes an adsorption member 430.

Referring to FIG. 17, the jig 400a may further include an adsorption member 430 disposed on the outer surface thereof.

In an embodiment, the adsorption member 430 is disposed on the first flat surface FS1, the second flat surface FS2, and the curved surface CS of the jig 400a. When the jig 400a is inserted into the glass GL, the adsorption member 430 is disposed between the jig 400a and the glass GL. At least part of the adsorption member 430 may be bent or curved in accordance with the shape of the curved surface CS. For example, a part of the adsorption member 430 disposed on the curved surface CS may be bent in a C shape or a U shape.

One side surface of the adsorption member 430 facing the jig 400a may include an adhesive layer, and the other side surface facing the one side surface may include an adhesive layer. Accordingly, despite the insertion and extraction of the jig 400a, the adsorption member 430 may remain fixed to the jig 400a and may provide a predetermined fixing force for supporting the glass GL.

The adsorption member 430 may include an adsorption film. The adsorption film may include, for example, a polymer resin such as polyimide, polyester, or polyolefin. and/or silicone. In an embodiment, the adsorption film includes an optically clear adhesive (OCA) and a pressure sensitive adhesive (PSA).

Since the embodiment of FIG. 17 is substantially the same as or similar to the embodiment of FIG. 15 except that the jig 400a further includes the adsorption member 430, a redundant description will be omitted.

Figure 18:
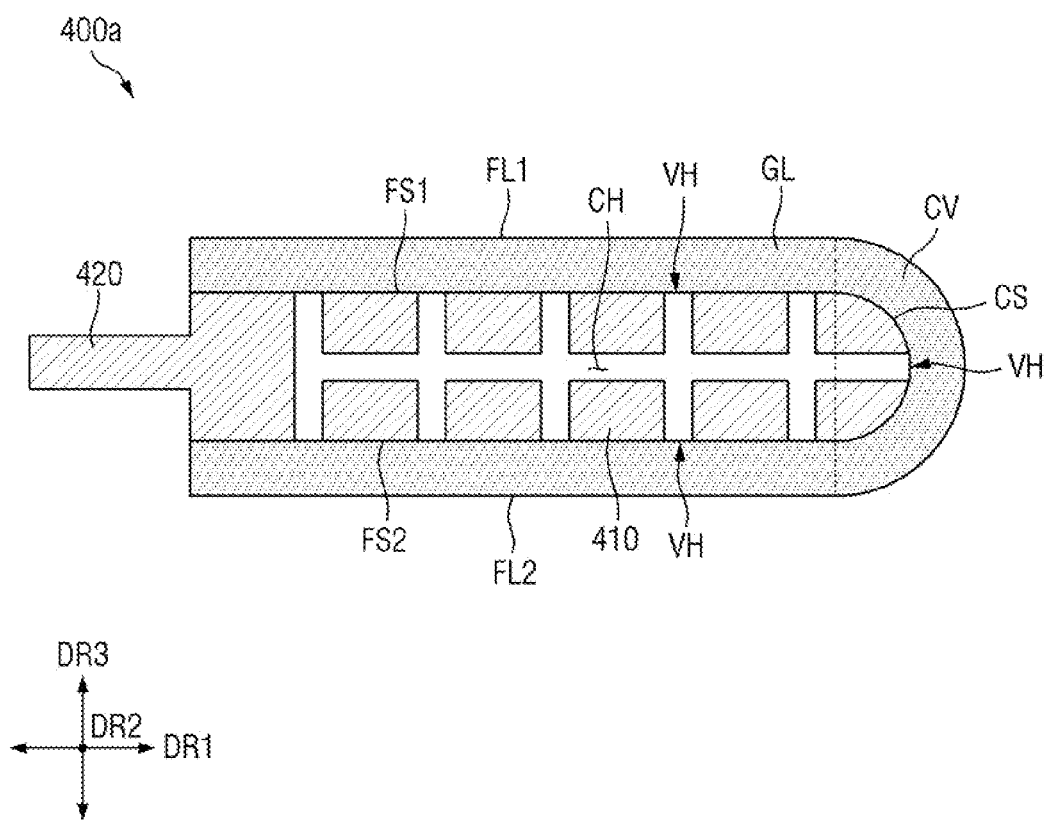
FIG. 18 is a cross-sectional view of a jig for glass processing according to an embodiment of the invention.

FIG. 18 is a cross-sectional view of a jig for glass processing according to an embodiment of the invention.

The embodiment of FIG. 18 is different from the embodiment of FIG. 15 in that a jig 400b further includes a vacuum hole VH and a flow path CH.

Referring to FIG. 18, the jig 400b further includes a vacuum hole VH provided in at least one of the first flat surface FS1, the second flat surface FS2, and the curved surface CS, and a flow path CH connected to the vacuum hole VH and penetrating the inside of the body portion 410. In an embodiment, a plurality of vacuum holes VH are arranged at the first flat surface FS1, the second flat surface FS2, and the curved surface CS at regular intervals. A negative pressure may be formed inside the flow path CH connected to the vacuum hole VH to adsorb and fix the glass GL disposed on the vacuum hole VH. In some embodiments, although not shown, the jig 400b may further include an air inlet connected to the flow path CH on at least one side surface thereof. For example, referring to FIGS. 14 and 15, the jig 400b may further include two air inlets respectively disposed on both side surfaces extending in the second direction DR2. In an embodiment, the air inlet is connected to another flow path CH provided in the first groove 500_H1 of the stage 500, and thus the flow path CH of the jig 400b and the flow path CH of the stage 500 may communicate with each other when the jig 400b is placed within the receiving groove 500_H of the stage 500.

Since the embodiment of FIG. 18 is substantially the same as or similar to the embodiment of FIG. 15 except that the jig 400b further includes a vacuum hole VH and a flow path CH, a redundant description will be omitted.

Figure 19:
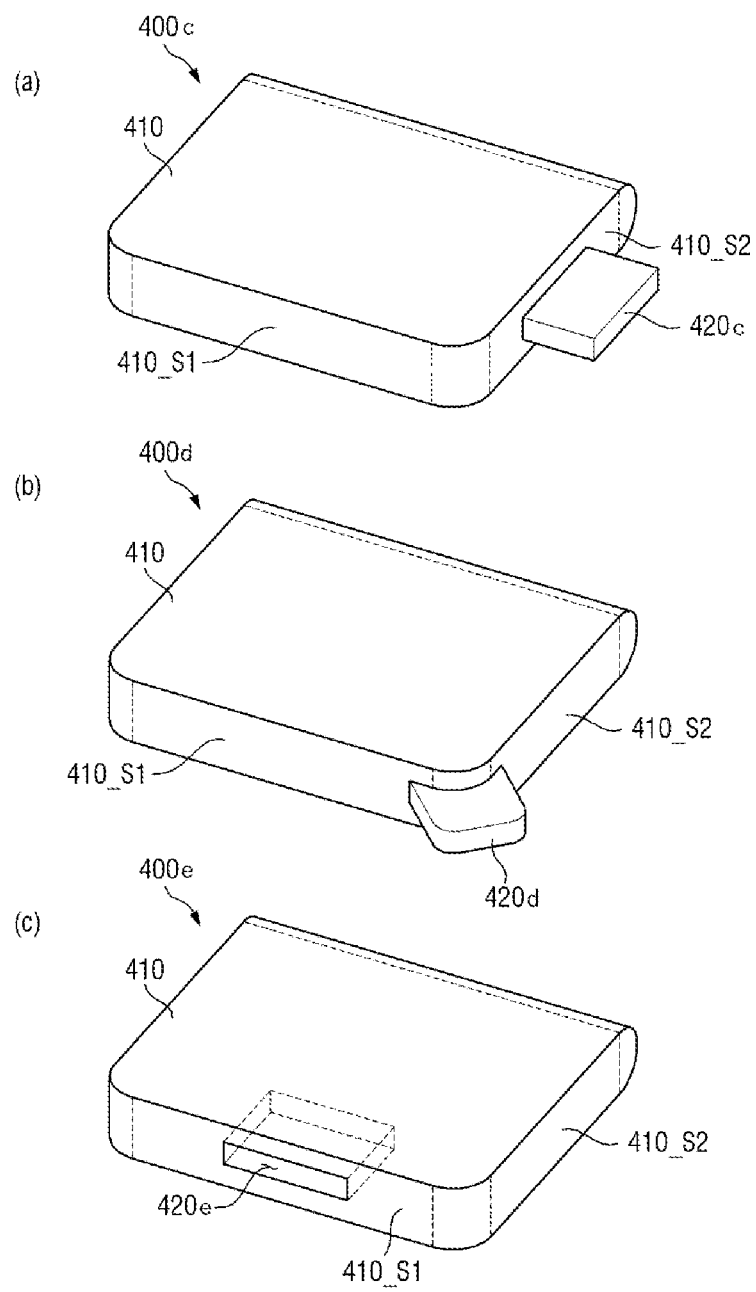
FIG. 19 is a perspective view illustrating jigs for glass processing according to an embodiment of the invention.

FIG. 19 is a perspective view illustrating jigs for glass processing according to an embodiment of the invention.

The embodiments of FIG. 19 are different from the embodiment of FIG. 15 in the arrangement and shape of handle portions 420c to 420e.

Referring to part (a) of FIG. 19, in an embodiment, the handle portion 420c is disposed to protrude in a direction crossing the insertion direction of the jig 400c. Specifically, one handle portion 420c may be disposed on any one of side surfaces extending in the second direction DR2 of the jig 400c. In some embodiments, two handle portions 420c are respectively disposed on two side surfaces extending in the second direction DR2 of the jig 400c.

Referring to part (b) of FIG. 19, in an embodiment, the handle portion 420d is disposed at a corner of the jig 400d. Specifically, the handle portion 420d may be disposed to protrude from a side surface disposed between the corners of the rounded first flat surface FS1 and the rounded second flat surface FS2. The side surface may extend in a vertical direction so as to have a predetermined height, and may have a convex curvature. In an embodiment, the handle portion 420d protrudes to form an angle of about 40° to 50° with respect to the insertion direction of the jig 400d.

Referring to part (c) of FIG. 19, in an embodiment, the handle portion 420e is disposed to have a shape recessed from at least one side surface between the first flat surface FS1 and the second flat surface FS2. For example, the handle portion 420e may extend in the first direction DR1 and may be recessed to have a predetermined depth toward the curved surface CS on a side surface opposite to the curved surface CS. In an embodiment, the handle portion 420e is disposed on at least one of both side surfaces extending in the second direction DR2. In an embodiment, a portion of the handle portion 420e is located within the jig 400e, and a remaining portion of the handle portion 420e protrudes outside the jig 400e.

Since the embodiments of FIG. 19 are substantially the same as or similar to the embodiment of FIG. 15 except for the arrangement and shapes of the handle portions 420c to 420e, a redundant description will be omitted.

Figure 20:
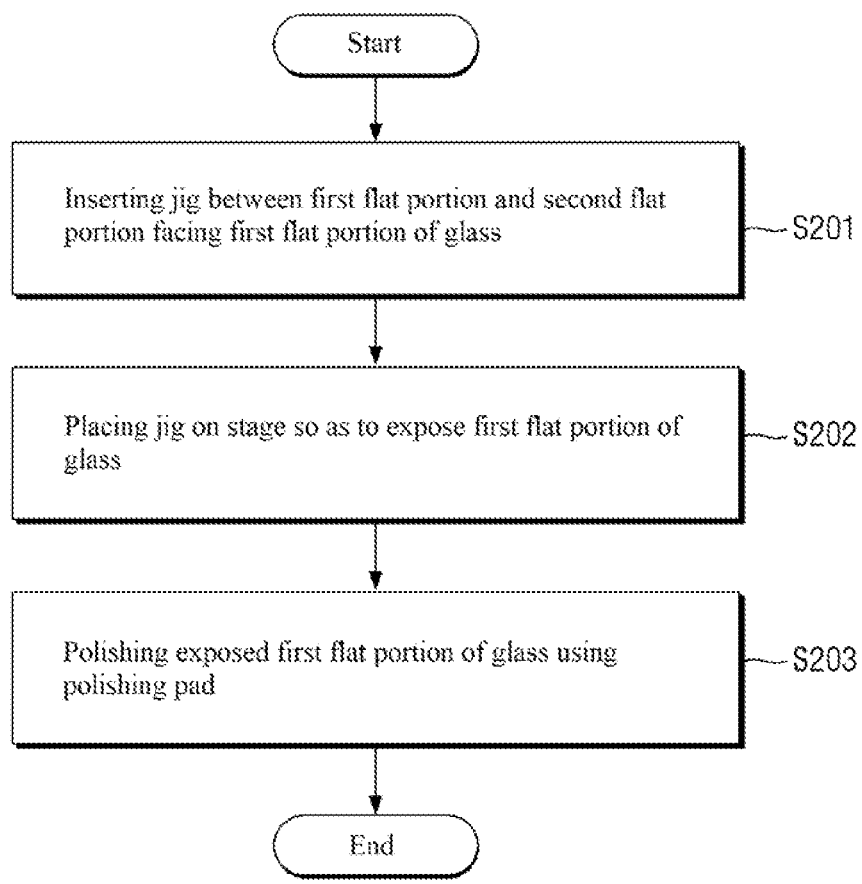
FIG. 20 is a flowchart of a glass manufacturing method according to an embodiment of the invention.

FIG. 20 is a flowchart of a glass manufacturing method according to an embodiment of the invention, and FIGS. 21 to 24 are views illustrating steps of the glass manufacturing method of FIG. 20 according to an embodiment of the invention.

The following glass manufacturing method may be performed by the jig 400 for glass processing and/or the glass manufacturing apparatus 20 of FIGS. 14 to 19. The glass manufacturing method may include a polishing process.

Referring to FIG. 20, the glass manufacturing method includes inserting a jig 400 for glass processing into a glass GL including a first flat portion FL1, a second flat portion FL2 facing the first flat portion FL1, and a curved portion CV connecting one side of the first flat portion FL1 and one side of the second flat portion FL2 (step 201). The method of FIG. 20 further includes placing the jig 400 on a stage 500 to expose the first flat portion FL1 of the glass GL (step 202). For example, the first flat portion FL1 may be exposed upward. The method of FIG. 20 further includes polishing the exposed first flat portion FL1 of the glass GL using a polishing pad 600 (step 203).

The glass manufacturing method may further include a step of turning the jig 400 over such that the second flat portion FL2 of the glass GL is exposed upward after polishing the first flat portion FL1, and a step of polishing the exposed second flat portion FL2 using the polishing pad 600.

The glass manufacturing method is not limited to the above embodiment, and at least some of the steps may be omitted, or at least one step may be further included with reference to FIGS. 14 to 19.

Hereinafter, an embodiment of the glass manufacturing method will be described in further detail with reference to FIGS. 21 to 24.

Referring to FIG. 21, a glass GL and a jig 400 inserted into the glass GL are mounted on a stage 500. The glass GL and the jig 400 inserted therein may be at least partially fit into a receiving groove provided on the upper surface of the stage 500. In an embodiment, the glass GL and the jig 400 inserted therein is mounted in the receiving groove such that the first flat portion FL1 of the glass GL is exposed upward. As shown in FIG. 21, one side of the second flat portion FL2 and one side the curved portion CV of the glass GL may be placed on the inner surface of the receiving groove, and the second flat surface FS2 of the jig 400 may be disposed to face the inner surface of the receiving groove. The curved portion CV of the glass GL and/or the handle portion 420 of the jig 400 may be placed completely within the receiving groove, or may be accommodated such that a part thereof protrudes from the upper surface of the stage 500. In an embodiment, the second flat portion FL2 of the glass GL is polished first.

Figure 22:
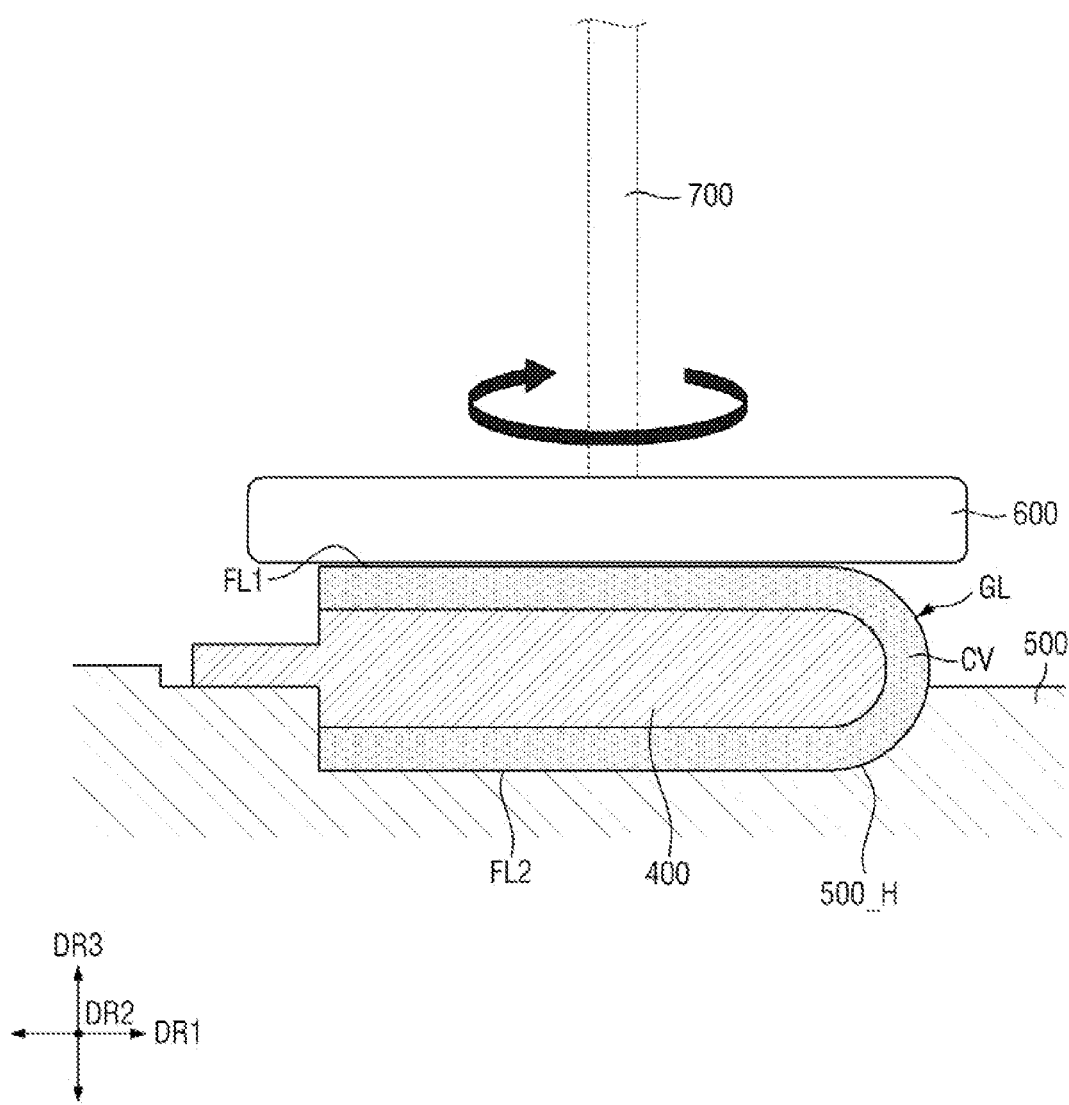

Referring to FIG. 22, after the glass GL and the jig 400 inserted therein are mounted on the stage 500, a polishing pad moving unit 700 moves a polishing pad 600 (e.g., in a descending direction) toward the first flat portion FL1 of the glass GL. When the polishing pad and the glass GL are in close contact with each other, the polishing pad 600 rotates about an arbitrary axis in the vertical direction to polish the outer surface of the first flat portion FL1 of the glass GL. In an embodiment, the exposed part of the curved portion CV of the glass GL is also polished.

Figure 23:
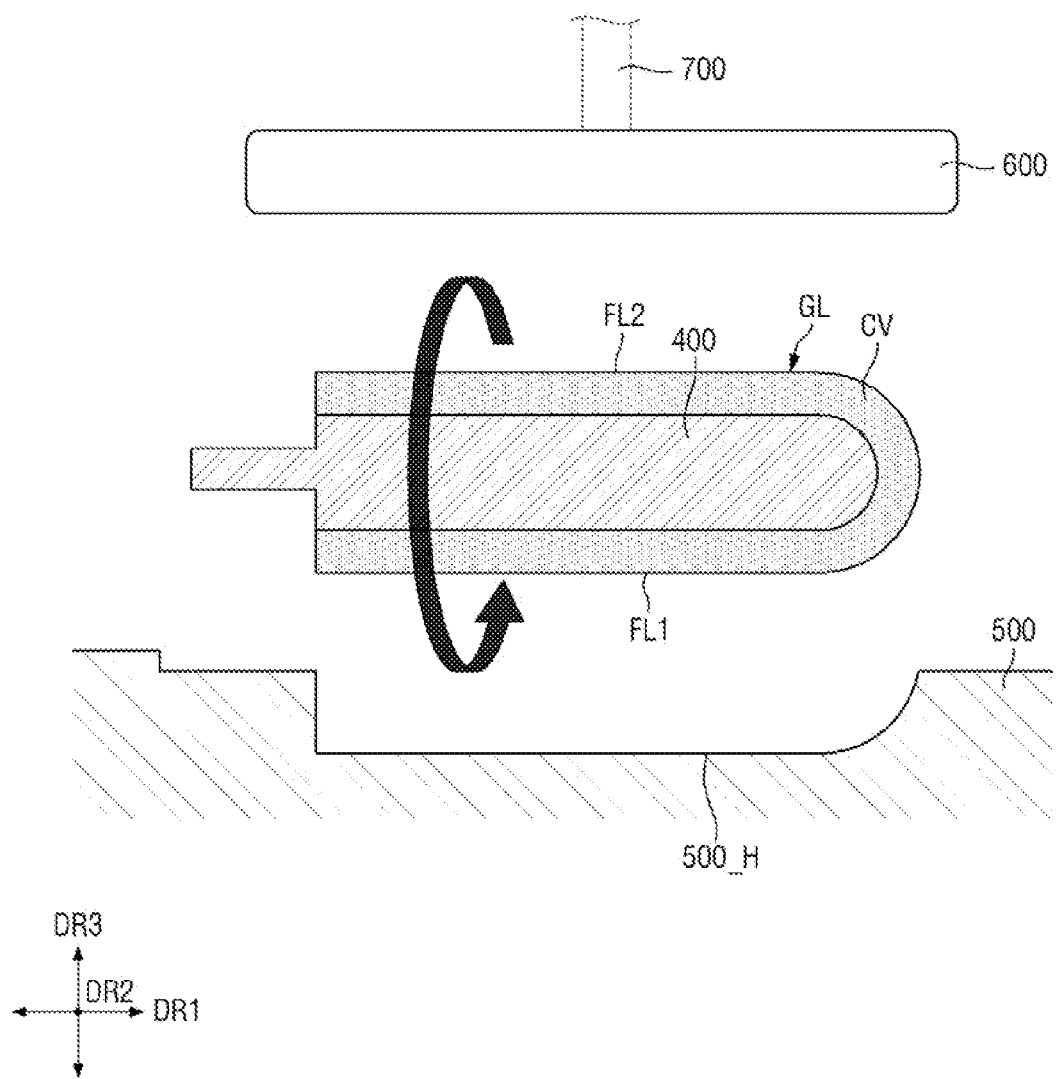

Referring to FIG. 23, after completing the polishing of the first flat portion FL1 of the glass GL, the polishing pad moving unit 700 moves the polishing pad 600 (e.g., in an ascending direction) such that the polishing pad 600 is spaced apart from the glass GL, and the glass GL and the jig 400 inserted therein are turned over such that the second flat portion FL2 is exposed upwards.

Figure 24:
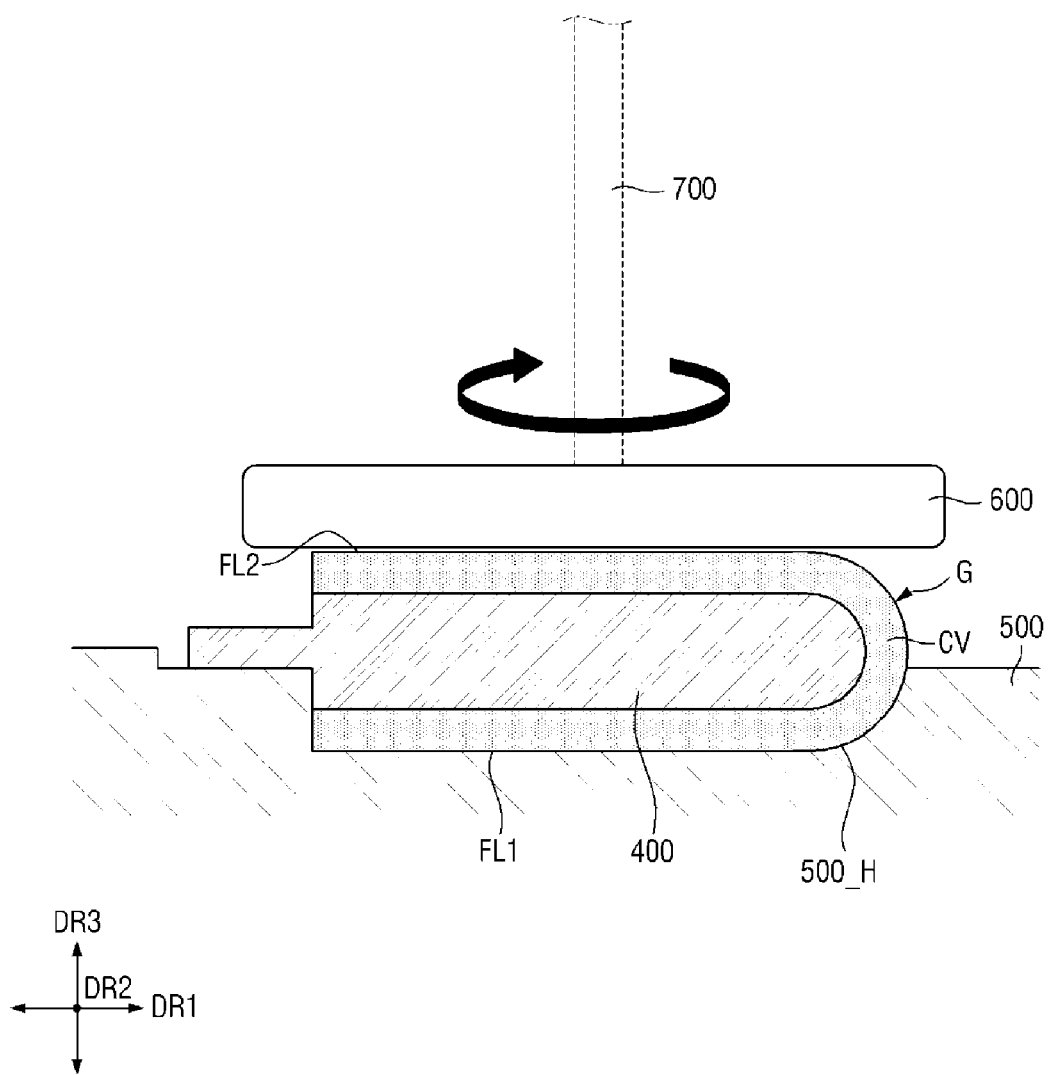

Referring to FIG. 24, after the glass GL and the jig 400 inserted therein are turned over, the glass GL and the jig 400 inserted therein are placed into the receiving groove of the stage 500 again. As shown in FIG. 24, the other side of the second flat portion FL2 and the other side the curved portion CV of the glass GL may be placed on the inner surface of the receiving groove, and the first flat surface FS2 of the jig 400 may be disposed to face the inner surface of the receiving groove. As described above, the curved portion CV of the glass GL and/or the handle portion 420 of the jig 400 may be completely fit within the receiving groove, or may be accommodated such that a part thereof protrudes from the upper surface of the stage 500. Thereafter, the polishing pad 600 may be moved downward toward the first flat portion FL1 of the glass GL by the polishing pad moving unit 700 to polish the outer surface of the second flat portion FL2 of the glass GL. In an embodiment, the other side of the curved portion CV of the glass GL is polished together with the flat portions.

FIG. 25 is a view illustrating a glass manufacturing method according to an embodiment of the disclosure.

The glass manufacturing method may be performed using the jigs 400 for glass processing of FIGS. 14 to 19. The glass manufacturing method may include a cutting process.

Referring to FIG. 25, as described above, the jig 400 for glass processing may be applied to a cutting process. The cutting process may include a process of cutting the glass GL having a large size into glasses GL' each having a predetermined unit size. In an embodiment, unlike the case illustrated in FIG. 5, the cutting process is performed after the forming process.

Referring to part (a) of FIG. 25, a ledger of glass GL having a large area is thermoformed to be bent in a U shape, and then the jig 400 is inserted into the inner space of the U-shaped glass GL.

Referring to part (b) of FIG. 25, thereafter, the glass GL and the jig 400 inserted therein are cut into glasses GL' each having a predetermined unit size by a cutting means. Thereby, the forming process may be simplified, and the tolerance due to the thermoforming and/or the cutting process may be improved.

According to at least one embodiment of a glass manufacturing apparatus and a glass manufacturing method using the same described above, a glass product bent in a U-shape may be polished more easily.

Although embodiments of the present invention have been disclosed for illustrative purposes, those of ordinary skill in the art will appreciate that various modifications, additions and substitutions are possible, without departing from the scope and spirit of the invention.

What is claimed is:

1. A glass manufacturing apparatus, comprising:
   a support configured to hold a glass including a first flat portion, a second flat portion, and a curved portion connecting the first flat portion to the second flat portion; and
   a polishing pad configured to move in at least one direction,
   wherein the support includes a first flat surface supporting the first flat portion, a second flat surface facing the first flat surface and supporting the second flat portion, and a curved surface connecting the first flat surface to the second flat surface and supporting the curved portion,
   wherein the support includes a base and a plurality of protrusions protruding from the base, and a distance between the plurality of protrusions is greater than a thickness of the polishing pad.

2. The glass manufacturing apparatus of claim 1, wherein each of a length from one side of the first flat surface to an end of the first flat surface and a length from one side of the second flat surface to an end of the second flat surface is 2 times or more a length between the first flat surface and the second flat surface.

3. The glass manufacturing apparatus of claim 1, wherein the support includes a vacuum hole located in at least one of the first flat surface, the second flat surface, and the curved surface.

4. The glass manufacturing apparatus of claim 1, wherein the polishing pad moves and rotates in accordance with a shape of the curved portion of the glass so as to polish one convex side surface of the curved portion.

5. The glass manufacturing apparatus of claim 1, wherein the distance between the plurality of protrusions is greater than a radius of the polishing pad.

6. The glass manufacturing apparatus of claim 1, wherein the glass includes an inner surface facing a space at least partially surrounded by the first flat portion, the second flat portion, and the curved portion, and wherein the first flat portion, the second flat portion, and the curved portion support the inner surface of the glass.

7. The glass manufacturing apparatus of claim 6, wherein the inner surface of the glass is disposed at the curved portion of the glass and has a concave shape, and wherein the curved surface of the support has a convex shape.

8. A glass manufacturing apparatus, comprising:
a jig configured to be at least partially inserted into a glass including a first flat portion, a second flat portion, and a curved portion connecting the first flat portion to the second flat portion;
a polishing pad configured to move in at least one direction; and
a stage disposed under the polishing pad and including an upper surface facing the polishing pad and a receiving groove disposed on the upper surface,
wherein the jig includes a first flat surface supporting the first flat portion, a second flat surface facing the first flat surface and supporting the second flat portion, and a curved surface connecting the first flat surface to the second flat surface and supporting the curved portion.

9. The glass manufacturing apparatus of claim 8, wherein the jig further includes an adsorption member disposed on the first flat surface, the second flat surface, and the curved surface.

10. The glass manufacturing apparatus of claim 8, wherein the jig includes a vacuum hole provided in at least one of the first flat surface, the second flat surface, and the curved surface.

11. A glass manufacturing apparatus, comprising:
a jig configured to be at least partially inserted into a glass including a first flat portion, a second flat portion, and a curved portion connecting the first flat portion to the second flat portion,
wherein the jig includes a first flat surface supporting the first flat portion, a second flat surface facing the first flat surface and supporting the second flat portion, and a curved surface connecting the first flat surface to the second flat surface and supporting the curved portion, and
wherein the jig further includes at least one side surface disposed between the first flat surface and the second flat surface, and an air inlet disposed on the at least one side surface.

12. The glass manufacturing apparatus of claim 8, wherein the jig further includes at least one side surface disposed between the first flat surface and the second flat surface, and a handle portion disposed on the at least one side surface.

13. The glass manufacturing apparatus of claim 12, wherein a thickness of the handle portion is smaller than a thickness of the jig.

14. The glass manufacturing apparatus of claim 8, wherein the receiving groove includes a first groove for receiving one side of the glass into which the jig is inserted, and a second groove connected to the first groove and having a smaller size than the first groove.

15. The glass manufacturing apparatus of claim 8, wherein the glass includes an inner surface facing a space at least partially surrounded by the first flat portion, the second flat portion, and the curved portion, and wherein the first flat portion, the second flat portion, and the curved portion support the inner surface of the glass.

16. The glass manufacturing apparatus of claim 15, wherein the inner surface of the glass is disposed at the curved portion of the glass, has a concave shape, and the curved surface has a convex shape.

* * * * *